(12) United States Patent
Endo

(10) Patent No.: US 11,302,369 B2
(45) Date of Patent: Apr. 12, 2022

(54) MEMORY SYSTEM AND CONTROLLING METHOD

(71) Applicant: Kioxia Corporation, Tokyo (JP)

(72) Inventor: Shizuka Endo, Yokohama (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/199,507

(22) Filed: Mar. 12, 2021

(65) Prior Publication Data

US 2022/0084568 A1    Mar. 17, 2022

(30) Foreign Application Priority Data

Sep. 14, 2020   (JP) .............................. JP2020-153869

(51) Int. Cl.
*G11C 7/10*   (2006.01)
*G11C 29/42*   (2006.01)

(52) U.S. Cl.
CPC ............ *G11C 7/1087* (2013.01); *G11C 7/106* (2013.01); *G11C 7/1057* (2013.01); *G11C 7/1084* (2013.01); *G11C 29/42* (2013.01)

(58) Field of Classification Search
CPC ..... G11C 7/1087; G11C 7/1057; G11C 7/106; G11C 7/1084; G11C 29/42
See application file for complete search history.

(56) References Cited

U.S. PATENT DOCUMENTS

| | | | |
|---|---|---|---|
| 2019/0050343 A1 | 2/2019 | Erez et al. | |
| 2019/0087263 A1* | 3/2019 | Cha ..................... | G06F 11/1072 |
| 2019/0196723 A1 | 6/2019 | Yano et al. | |
| 2020/0042230 A1* | 2/2020 | Li ......................... | G06F 3/0604 |

FOREIGN PATENT DOCUMENTS

| | | |
|---|---|---|
| JP | 2011-095853 A | 5/2011 |
| TW | 200819976 A | 5/2008 |

* cited by examiner

*Primary Examiner* — Han Yang
(74) *Attorney, Agent, or Firm* — Oblon, McClelland, Maier & Neustadt, L.L.P.

(57) ABSTRACT

A memory system includes a controller that: in a case where first data being a read target is stored across a first storage area of a first plane and a second storage area of a second plane, causes a memory chip to perform sensing to second data including a first fragment of the first data; causes the memory chip to perform sensing to third data including a second fragment of the first data stored in the second storage area; stores the second data in a first buffer; stores the third data in a second buffer; reads the first and second fragments from the first and second buffers respectively; combines the fragments to generate fourth data; and inputs the fourth data to an error correction circuit.

20 Claims, 17 Drawing Sheets

FIG.15

| STEP | PROCESSING | VALUE OF COUNTER CORRESPONDING TO WAITING BUFFER #0 | VALUE OF COUNTER CORRESPONDING TO WAITING BUFFER #1 |
|---|---|---|---|
| S601 | START EXECUTION OF SECOND READ COMMAND (CL1) (SENSE OPERATION + PAGE TRANSFER + WAITING BUFFER #0 OUTPUT) | 1 (+1) | 0 |
| S602 | START EXECUTION OF SECOND READ COMMAND (CL3b) (SENSE OPERATION + PAGE TRANSFER + WAITING BUFFER #1 OUTPUT) | 1 (±0) | 1 (+1) |
| S603 | START EXECUTION OF SECOND READ COMMAND (CL2) (WAITING BUFFER #0 OUTPUT) | 2 (+1) | 1 (±0) |
| S604 | START EXECUTION OF SECOND READ COMMAND (CL3a) (WAITING BUFFER #0 OUTPUT) | 3 (+1) | 1 (±0) |
| S605 | START EXECUTION OF SECOND READ COMMAND (CL4) (WAITING BUFFER #1 OUTPUT) | 3 (±0) | 2 (+1) |
| S606 | START EXECUTION OF SECOND READ COMMAND (CL5) (WAITING BUFFER #1 OUTPUT) | 3 (±0) | 3 (+1) |
| S607 | START EXECUTION OF SECOND READ COMMAND (CL6) (WAITING BUFFER #1 OUTPUT) | 3 (±0) | 4 (+1) |
| S608 | COMPLETION OF OUTPUT OF CLUSTER CL1 | 2 (-1) | 4 (±0) |
| S609 | COMPLETION OF OUTPUT OF CLUSTER CL2 | 1 (-1) | 4 (±0) |
| S610 | COMPLETION OF OUTPUT OF CLUSTER CL3a | 0 (-1) | 4 (±0) |
| S611 | COMPLETION OF OUTPUT OF CLUSTER CL3b | 0 (±0) | 3 (-1) |
| S612 | COMPLETION OF OUTPUT OF CLUSTER CL4 | 0 (±0) | 2 (-1) |
| S613 | COMPLETION OF OUTPUT OF CLUSTER CL5 | 0 (±0) | 1 (-1) |
| S614 | COMPLETION OF OUTPUT OF CLUSTER CL6 | 0 (±0) | 0 (-1) |

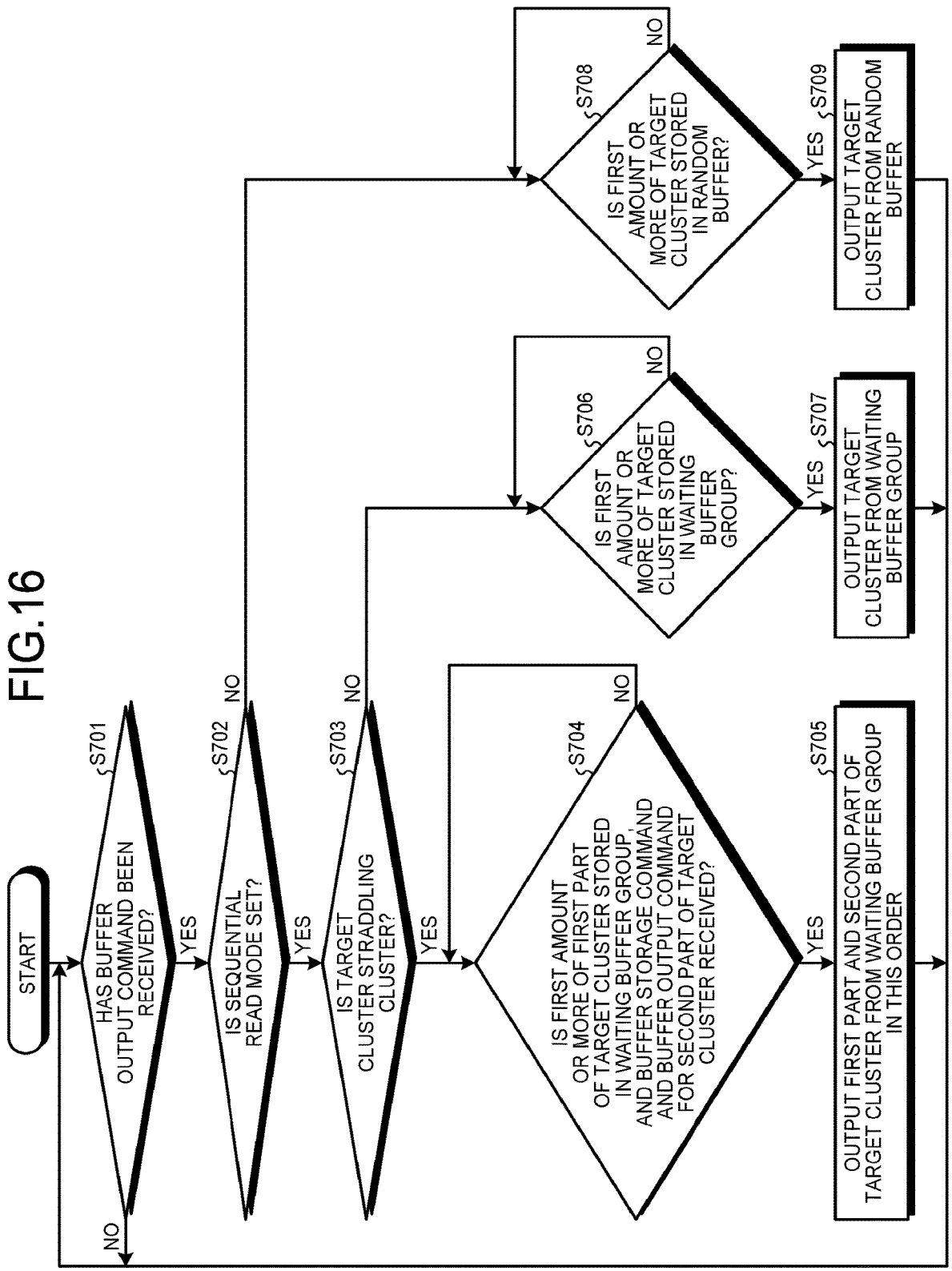

MEMORY SYSTEM AND CONTROLLING METHOD

CROSS-REFERENCE TO RELATED APPLICATIONS

This application is based upon and claims the benefit of priority from Japanese Patent Application No. 2020-153869, filed on Sep. 14, 2020; the entire contents of which are incorporated herein by reference.

FIELD

Embodiments described herein relate generally to a memory system and a controlling method of a memory chip.

BACKGROUND

Memory systems are known, which incorporate a memory chip including a memory cell array, and a controller that inputs and outputs data to and from the memory chip. There has been a request for such a memory system to increase a data transfer rate from the memory chip to the controller as much as possible.

BRIEF DESCRIPTION OF THE DRAWINGS

FIG. 15 is a view illustrating a method for managing a waiting buffer group in the embodiment;

FIG. 16 is a flowchart illustrating an exemplary operation of the waiting buffer group and a random buffer in the embodiment.

DETAILED DESCRIPTION

According to one embodiment, in general, a memory system includes a memory chip, a plurality of buffers, and a controller. The memory chip includes a first plane and a second plane. The first plane includes a first storage area from which data is read in a unit of a first size, and a first data latch capable of storing data having the first size. The second plane includes a second storage area from which data is read in a unit of the first size, and a second data latch capable of storing data having the first size. The plurality of buffers includes a first buffer and a second buffer. Each of the plurality of buffers is capable of storing data having the first size. The controller includes an error correction circuit. In a case where first data having a second size smaller than the first size is stored across the first storage area and the second storage area, the controller: causes the memory chip to store second data in the first data latch, the second data having the first size and including a first fragment of the first data stored in the first storage area; causes the memory chip to store third data in the second data latch, the third data having the first size and including a second fragment of the first data stored in the second storage area; causes the memory chip to output the second data from the first data latch and stores the output second data in a first buffer; causes the memory chip to output third data from the second data latch and stores the output third data in a second buffer; combines the first fragment in the second data stored in the first buffer and the second fragment in the third data stored in the second buffer to generate fourth data; and inputs the fourth data to the error correction circuit.

Hereinafter, a memory system according to an embodiment will be described in detail with reference to the accompanying drawings. The following embodiment is presented for illustrative purpose only and unintended to limit the scope of the present invention.

Embodiment

Figure 1:
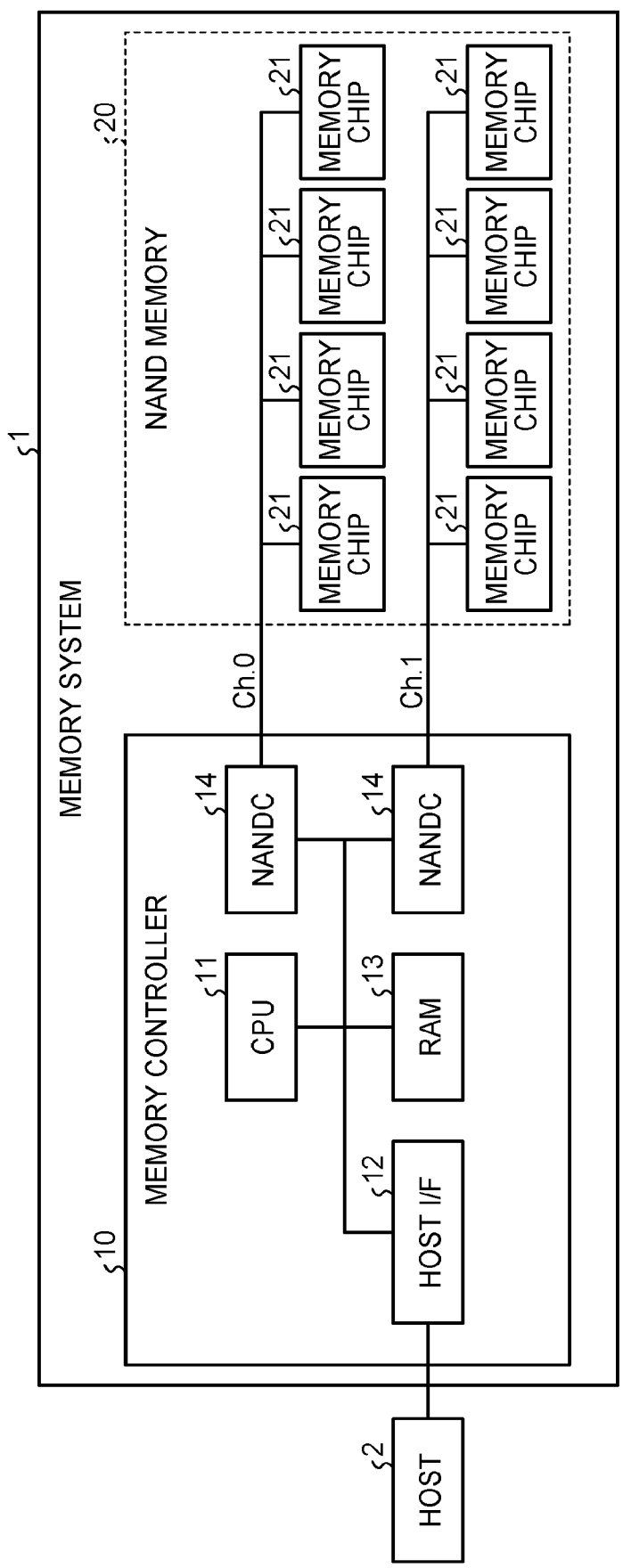
FIG. 1 is a diagram illustrating an exemplary configuration of a memory system according to an embodiment, which is connected to a host.

FIG. 1 is a diagram illustrating an exemplary configuration of a memory system according to an embodiment, which is connected to a host. As illustrated in FIG. 1, a memory system 1 is connectable to a host 2. The host 2 represents an information processing device such as a server, a personal computer, or a mobile terminal. The memory system 1 functions as an external storage device for the host 2. The host 2 can transmit access requests, such as a read request and a write request, to the memory system 1.

The memory system 1 includes one or more memory chips 21 and a memory controller 10. Each of the memory chips 21 is, for example, a NAND type flash memory and is capable of storing data in a non-volatile manner. According to the example illustrated in FIG. 1, the memory system 1 includes eight memory chips 21. A group of the eight memory chips 21 may be referred to as NAND memory 20. The number of the memory chips 21 in the memory system 1 is not limited to eight.

The memory system 1 includes one or more channels. According to the example illustrated in FIG. 1, the memory system 1 includes a total of two channels, channel 0 (Ch.0) and channel 1 (Ch.1). One end of each channel is connected to the memory controller 10.

Four memory chips 21 are commonly connected to channel 0. Four memory chips 21, different from the four memory chips 21 connected to channel 0, are commonly connected to channel 1. The memory controller 10 can control the four memory chips 21 connected to channel 0 and the four memory chips 21 connected to channel 1 independently.

The memory controller 10 performs data transfer between the host 2 and the NAND memory 20. For this purpose, the memory controller 10 includes a central processing unit (CPU) 11, a host interface (I/F) 12, a random access memory (RAN) 13, and one or more NAND controllers (NANDCs) 14. The memory controller 10 includes the same number of the NANDCs 14 as the number of channels, that is, two, by way of example.

The host I/F 12 is, for example, circuitry connected to the host 2 via a bus conforming to the serial advanced technology attachment (SATA) standard, the serial attached SCSI (SAS) standard, or the peripheral components interconnect express (PCIe) (registered trademark) standard. The host I/F 12 manages communications between the memory controller 10 and the host 2.

The RAM 13 can temporarily store various types of information. The CPU 11 may use the RAM 13 as an area into which various types of management information and firmware programs are loaded, to manage the control of the memory system 1. The RAM 13 is also useable as a queue, buffer, or cache. The RAM 13 is not limited to a particular type. The memory controller 10 may include a dynamic random access memory (DRAM), a static random access memory (SRAM), or a combination thereof. The memory controller 10 may incorporate any volatile memory instead of the RAM 13. The information stored in RAM 13 will be described later.

One of the two NANDCs 14 is connected to channel 0 and the other is connected to channel 1.

Each channel is a signal line group that includes a chip enable signal line CEn, a command latch enable signal line CLE, an address latch enable signal line ALE, a write enable signal line WEn, a read enable signal line pair RE/REn, a strobe signal line pair DQS/DQSn, an input/output (IO) signal line DQ[7:0], and a ready busy signal line R/Bn. The chip enable signal line CEn is for transferring a chip enable signal CEn. The chip enable signal CEn serves to place the memory chip 21 to be accessed in an enabled state. The IO signal line DQ[7:0] is for transferring a command, an addresses, and data. Herein, the IO signal line DQ has an 8-bit width, however the bit width of the IO signal line DQ is not limited thereto. The command latch enable signal line CLE is for transferring a command latch enable signal CLE. The command latch enable signal CLE indicates that a signal transferred through the IO signal line DQ[7:0] is a command. The address latch enable signal line ALE is for transferring an address latch enable signal ALE. The address latch enable signal ALE indicates that a signal transferred through the IO signal line DQ[7:0] is an address. The write enable signal line WEn is for transferring a write enable signal WEn. The write enable signal WEn serves to instruct the memory chip 21 to fetch the command or address transmitted via the IO signal line DQ[7:0]. The read enable signal line pair RE/REn is for transferring a read enable signal pair RE/REn. The read enable signal pair RE/REn serves to instruct the memory chip 21 as to data output timing when the memory controller 10 reads data from the memory chip 21. The strobe signal line pair DQS/DQSn is for transferring a strobe signal pair DQS/DQSn. The strobe signal pair DQS/DQSn is used for the memory chip 21 to instruct the memory controller 10 as to data fetch timing at the time of transferring data to the memory controller 10. The ready busy signal line R/Bn is for transferring a ready busy signal R/Bn. The ready busy signal R/Bn serves to notify the memory controller 10 of a ready state or a busy state of the memory chip 21. In the ready state, the memory chip 21 can receive a command, while in the busy state, the memory chip 21 cannot receive a command. The signal lines constituting each channel are not limited to these examples.

Each of the NANDCs 14 manages communications among the four memory chips 21 connected via the channel and the memory controller 10. Specifically, each NANDC is capable of transmitting command sets or transmitting and receiving data to and from the four memory chips 21 individually. Exemplary command sets transmitted to the four memory chips 21 from the NANDCs 14 will be described later.

The CPU 11 performs control of the memory system 1, including data transfer between the host 2 and the NAND memory 20, by controlling the host I/F 12, the RAM 13, and the NANDC 14 according to firmware program.

For example, the firmware program is pre-stored at a given location in the memory system 1, for example, in any of the memory chips 21. At startup of the memory system 1, the CPU 11 loads the firmware program from the memory chip 21 into the RAM 13. The CPU 11 then controls the memory system 1 by executing the firmware program loaded in the RAM 13. The location where the firmware program is pre-stored is not limited to the above example. In addition, the loading destination of the firmware program is not limited to the above example.

The memory controller 10 may be configured, for example, as a system-on-a-chip (SoC). The memory controller 10 may be configured as a field-programmable gate array (FPGA) or an application specific integrated circuit (ASIC). The memory controller 10 may be made up of a plurality of chips. The functions of the memory controller 10 may be implemented by a processor executing software (firmware), dedicated hardware, or a combination thereof.

Figure 2:
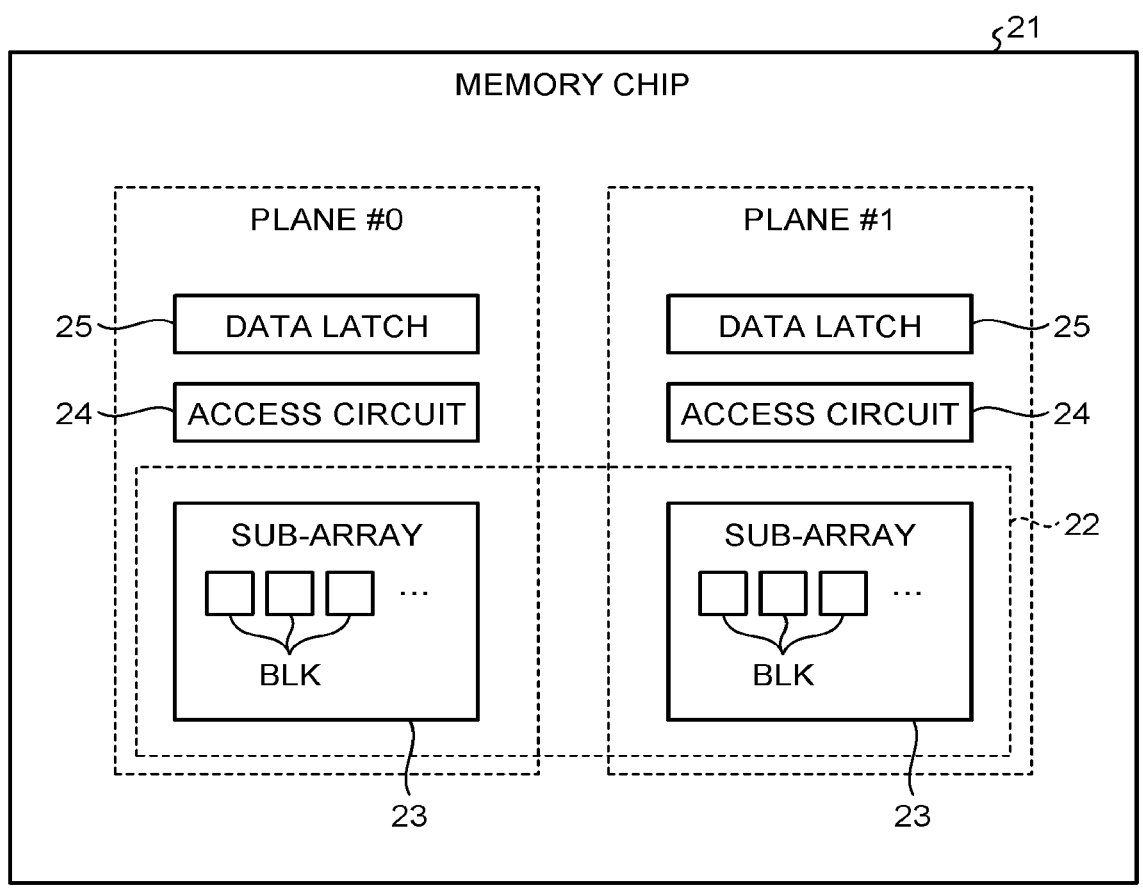
FIG. 2 is a schematic diagram illustrating an exemplary configuration of a memory chip in the embodiment.

FIG. 2 is a schematic diagram illustrating an exemplary configuration of the memory chip 21 in the embodiment. According to the example illustrated in FIG. 2, the memory chip 21 includes a memory cell array 22 divided into two sub-arrays 23, two access circuits 24, and two data latches 25. Each of the sub-arrays 23, together with one of the two access circuits 24 and one of the two data latches 25, constitutes one parallel operation element. That is, the memory chip 21 includes two parallel operation elements. The two parallel operation elements are operable independently of each other. Each of the parallel operation elements is referred to as a plane. The planes in each of the memory chips 21 are identified by plane numbers.

The access circuit 24 and the data latch 25 are provided in each of the planes, so that each of the sub-arrays 23 can be independently subjected to a write operation, a read operation, and an erase operation in each of the two planes.

One of the two planes of each of the memory chips 21 is referred to as plane #0 assigned with plane number zero and the other plane is referred to as plane #1 assigned with plane number one.

The number of planes included in each of the memory chips 21 is not limited to two.

Each of the sub-arrays 23 includes a plurality of blocks BLK. The block BLK are storage areas and a minimal unit of a data erase operation. That is, the entire data stored in one block BLK is erased at one data erase operation.

The access circuit 24 includes a row decoder, a column decoder, and a sense amplifier. The access circuit 24 can execute a write operation, a read operation, and a data erase operation to the sub-arrays 23 of its corresponding plane.

The write operation refers to an operation of the access circuit 24 that writes data sent from the memory controller 10 to the sub-array 23. The read operation refers to an operation of the access circuit 24 that reads data from the sub-array 23 and sends the data to the memory controller 10. The data erase operation refers to an operation of the access circuit 24 that erases data from the sub-array 23.

The data latch 25 serves as a storage element group that temporarily stores data to be written to the sub-arrays 23 of its corresponding plane and data read from its corresponding sub-array 23. In each plane, the access circuit 24 receives data to be written from the memory controller 10 and stores the data in the data latch 25, and writes the data to the sub-array 23, or reads data from the sub-array 23 and stores the data in the data latch 25. The access circuit 24 reads and transfers the data, which has been read from the sub-array 23, from the data latch 25 to the memory controller 10 in response to receipt of a given command set (data-out command set as described later) from the memory controller 10.

Of the read operation, reading data from the sub-array 23 to the data latch 25 is referred to as a sense operation. Of the read operation, transferring data from the data latch 25 to the memory controller 10 is referred to as a data-out operation.

Figure 3:
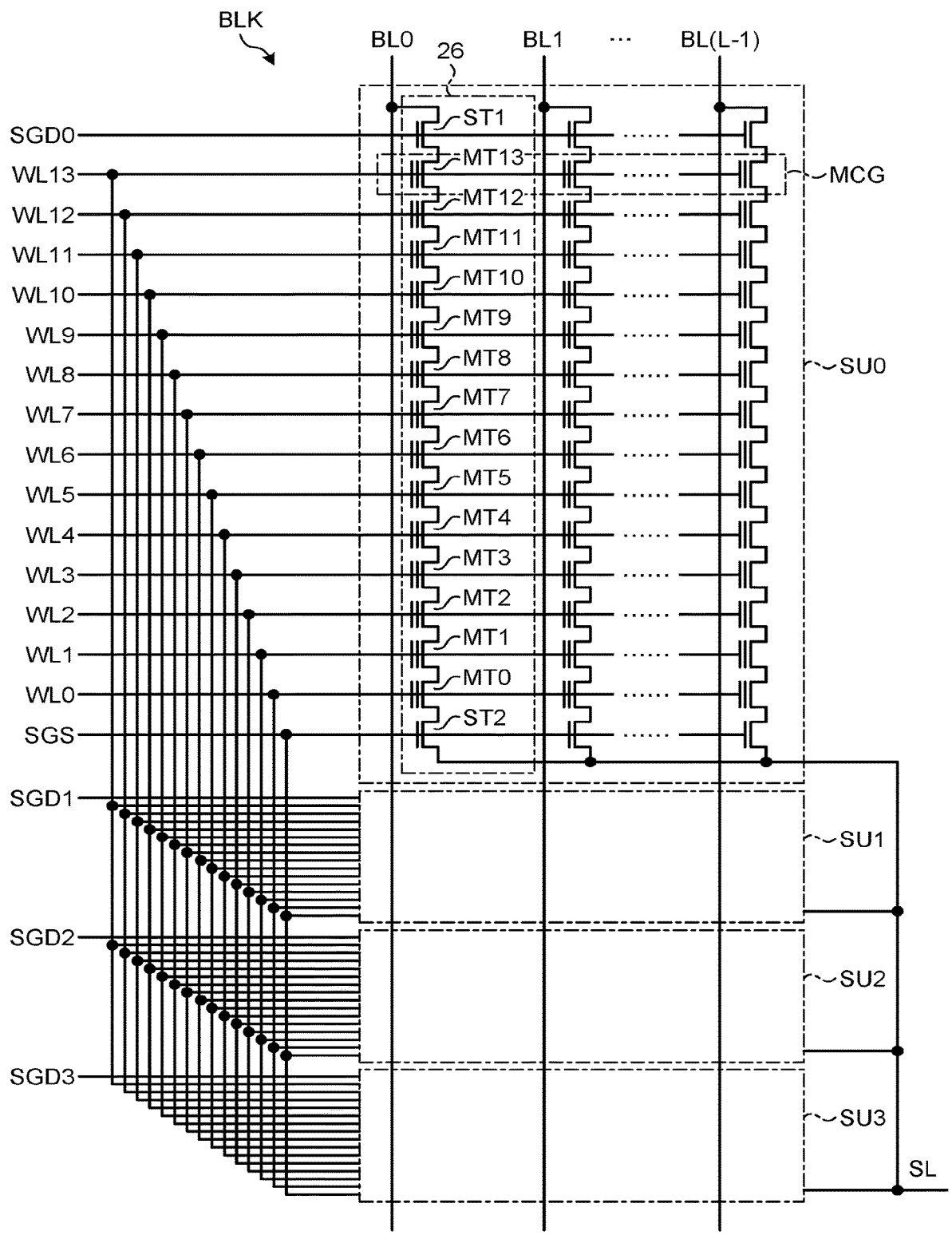
FIG. 3 is a view illustrating a circuit configuration of a block in the embodiment.

FIG. 3 is a view illustrating a circuit configuration of the block BLK in the embodiment. All the blocks BLK include the same configuration. Each block BLK includes, for example, four string units SU0 to SU3. Each of the string units SU includes a plurality of NAND strings 26.

Each of the NAND strings 26 includes, for example, fourteen memory cell transistors MT (MT0 to MT13) and two select transistors ST1 and ST2. The memory cell transistors MT each include a control gate and a charge storage layer, and store data in a non-volatile manner. The fourteen memory cell transistors MT (MT0 to MT13) are connected in series between the source of the select transistor ST1 and the drain of the select transistor ST2. The memory cell transistors MT may be metal-oxide-nitride-oxide-silicon (MONOS) transistors including an insulating film as the charge storage layer, or may be floating gate (FG) transistors including a conductive film as the charge storage layer. Further, the number of the memory cell transistors MT in the NAND string 26 is not limited to fourteen.

In the respective string units SU0 to SU3, the gates of the select transistors ST1 are connected to select gate lines SGD0 to SGD3, respectively. In the string units SU0 to SU3, the gates of the select transistors ST2 are commonly connected to, for example, a select gate line SGS. In the string units SU0 to SU3, the gates of the select transistors ST2 may be connected to different select gate lines SGS0 to SGS3. The control gates of the memory cell transistors MT0 to MT13 in the same block BLK are commonly connected to word lines WL0 to WL13, respectively.

The drains of the select transistors ST1 of the NAND strings 26 in each string unit SU are connected to different bit lines BL (BL0 to BL (L−1), where L is a natural number of two or more). In addition, the bit lines BL commonly connect one NAND string 26 in each of the string units SU among the blocks BLK. The sources of the select transistors ST2 are commonly connected to the source line SL.

That is, each string unit SU is a set of the NAND strings 26 connected to different bit lines BL and connected to the same select gate line SGD. Each block BLK is a set of the string units SU sharing the word line WL. The memory cell array 22 is a set of blocks BLK sharing the bit line BL.

As described above, the data erase operation is executed in units of the blocks BLK.

The write operation and the read operation (specifically, the sense operation) are collectively performed to memory cell transistors MT connected to one word line WL in one string unit SU. Hereinafter, a group of memory cell transistors MT collectively selected during the write operation and the read operation (specifically, the sense operation) is referred to as a memory cell group MCG. A set of 1-bit data to be written to or read (in other words, sensed) from each of the memory cell transistors MT of one memory cell group MCG is referred to as a page.

Each of the memory cell transistors MT can be configured to be able to store a multi-bit value. For example, in the case of the memory cell transistors MT capable of storing an n-bit ($n \geq 2$) value, the storage capacity per word line WL (i.e., per memory cell group MCG) is equal to a size of n-pages. The following will describe an exemplary method of storing a 3-bit value in each of the memory cell transistors MT. According to this method, three-page data is stored in each word line.

Figure 4:
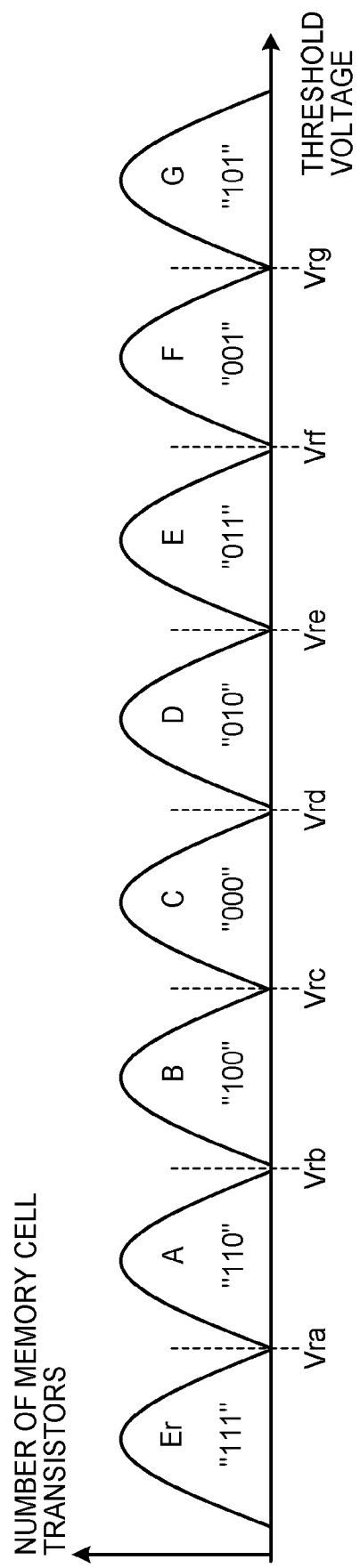
FIG. 4 is a view illustrating an example of data coding and a threshold voltage distribution in the embodiment.

FIG. 4 is a view illustrating an example of data coding and a threshold voltage distribution in the embodiment. The horizontal axis represents the threshold voltages of the memory cell transistors MT. Eight lobes illustrated in FIG. 4 schematically represent threshold voltage distributions. The eight threshold voltage distributions are threshold voltage areas and also referred to as states. The eight states correspond to 3-bit data values. In the example in FIG. 4, an Er-state corresponds to a data value of "111", an A-state corresponds to a data value of "110", and a B-state corresponds to a data value of "100", a C-state corresponds to a data value of "000", a D-state corresponds to a data value of "010", an E-state corresponds to a data value of "011", an F-state corresponds to a data value of "001", and a G-state corresponds to a data value of "101". The initial digit of each data value is set to the most significant bit (MSB). The last digit of each data value is set to the least significant bit (LSB). The correspondence between the states and the data values is not limited thereto.

The threshold voltages of the memory cell transistors MT are controlled to be included in any of the eight states. The threshold voltages of the memory cell transistors MT are set to the Er-state through the data erase operation and set to any of the A-state to the G-state corresponding to a data value through the write operation.

Through the sense operation, the threshold voltages are compared with two or more determination voltages to identify the state of the threshold voltage of each of the memory cell transistors MT. Then, a data value corresponding to the identified state is read. FIG. 4 depicts a combination of Vra, Vrb, Vrc, Vrd, Vre, Vrf, and Vrg as exemplary determination voltages.

A set of LSBs of three-page data stored in one word line WL (i.e., in one memory cell group MCG) is referred to as a lower page. A set of MSBs of three-page data is referred to as an upper page. A set of bits between the LSBs and the MSBs of three-page data is referred to as a middle page.

Data coding is not limited to such an example of the embodiment. The size of data stored in each of the memory cell transistors MT is not limited to three bits.

Figure 5:
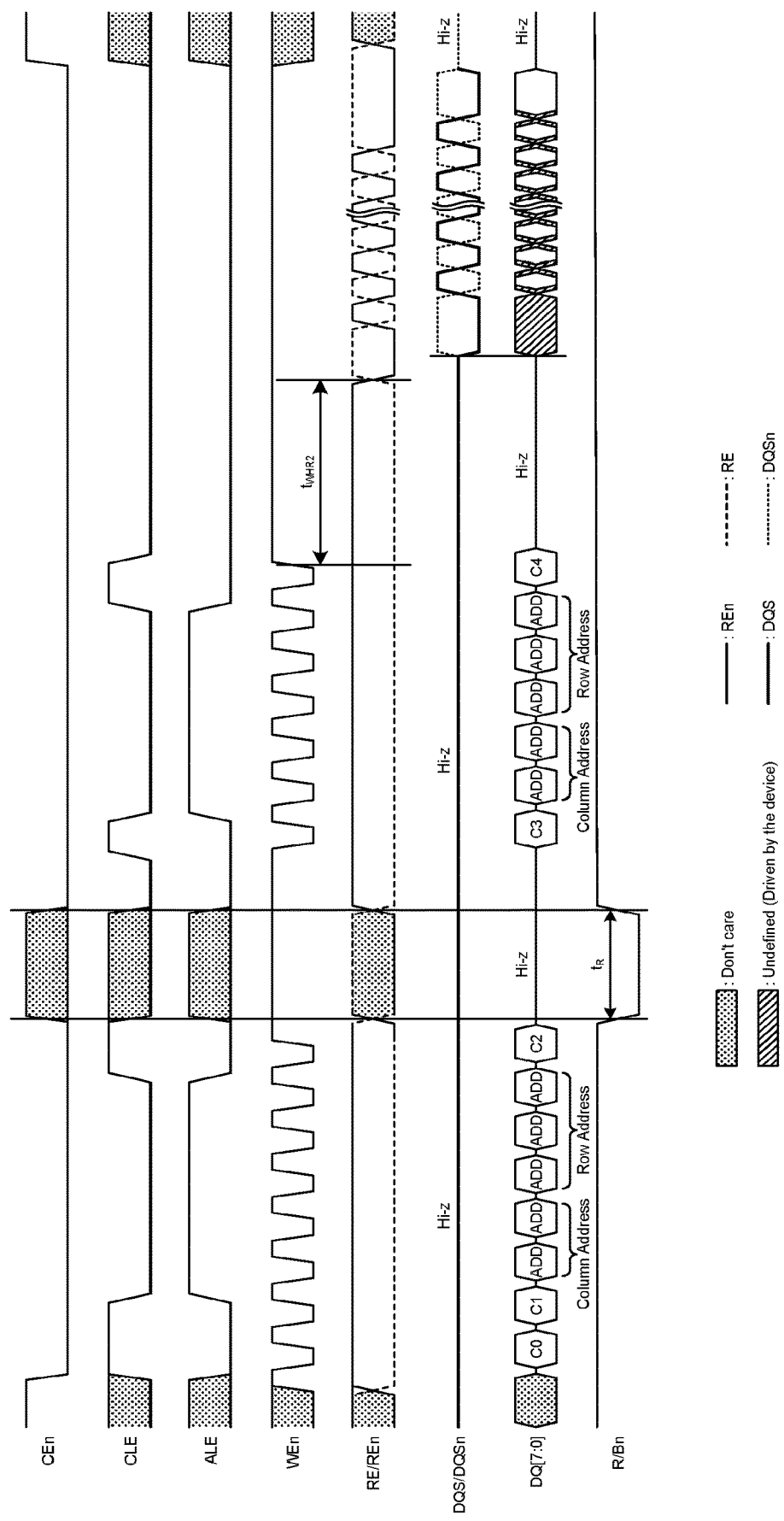
FIG. 5 is a timing chart illustrating exemplary signals transmitted and received between a NANDC and the memory chip during a read operation in the embodiment.

FIG. 5 is a timing chart illustrating exemplary signals transmitted and received between the NANDC 14 and the memory chip 21 connected to the NANDC 14 during the read operation in the embodiment. FIG. 5 illustrates the states of the respective signal lines of the read enable signal pair RE/REn, the strobe signal pair DQS/DQSn, the IO signal line DQ[7:0], and the ready busy signal R/Bn, among the signal line group constituting the channel connecting the NANDC 14 and the memory chips 21.

The NANDC 14 first transmits a page designation command C0, a read command C1, address information ADD, and a sense start command C2 in this order through the IO signal line DQ[7:0]. The NANDC 14 thereby gives an instruction as to a sense target page and the start of a sense operation. A set of the page designation command C0, the read command C1, the address information ADD, and the sense start command C2 is referred to as a sense command set. The sense command set is transmitted while the ready busy signal line R/Bn connected to the memory chip 21 that is a target of the sense operation is in a ready state.

At the time of transmitting the sense command set, the NANDC 14 maintains the chip enable signal CEn in an active state, i.e., low (L) level. At the time of transmitting the page designation command C0, the read command C1, and the sense start command C2, the NANDC 14 maintains the command latch enable signal CLE in an active state, i.e., high (H) level. At the time of transmitting the address information ADD, the NANDC 14 maintains the address latch enable signal ALE in an active state, i.e., high (H) level. At the time of transmitting the sense command set, the NANDC 14 toggles the write enable signal WEn.

In the sense command set, the page designation command C0 serves to designate one piece of data of one or more pages stored in one memory cell group MCG. The read command C1 indicates that a series of commands is for the sense operation. The address information ADD includes a row address indicating the memory cell group MCG that includes a sense target page. The sense target page in a storage area, provided in the sub-array 23, is uniquely designated by a combination of the page designation command C0 and the row address included in the address information ADD. In addition, the address information ADD includes a column address indicating a location in a page, that is, a bit-line location. However, the column address has no specific meaning in the sense command set. The sense start command C2 serves to give an instruction as to the start of the sense operation.

In response to receipt of the sense start command C2, the memory chip 21 starts the sense operation. In the sense operation, the access circuit 24 reads one-page data from the page uniquely designated by the combination of the page designation command C0 and the row address. The access circuit 24 stores the read one-page data in the data latch 25.

After start of the sense operation, the memory chip 21 allows the ready busy signal line R/Bn to transition from the ready state to the busy state. After completion of the sense operation, the memory chip 21 allows the ready busy signal line R/Bn to transition from the busy state to the ready state. That is, at time $t_R$ in FIG. 5 the sense operation is being executed. The NANDC 14 can recognize completion of the sense operation, that is, one-page data is read and stored in the data latch 25 from the target page, by monitoring the state of the ready busy signal line R/Bn after transmitting the sense start command C2.

After the sense operation, the NANDC 14 can cause the memory chip 21 to execute a data-out operation. The NANDC 14 transmits a data-out command C3, address information ADD, and a pre-fetch command C4 in this order through the IO signal line DQ[7:0] to cause the memory chip 21 to execute the data-out operation. A set of the data-out command C3, the address information ADD, and the pre-fetch command C4 is referred to as a data-out command set.

At the time of transmitting the data-out command set, the NANDC 14 maintains the chip enable signal CEn connected to the memory chip 21 that is a target of the data-out operation in the active state, i.e., low (L) level. At the time of transmitting the data-out command C3 and the pre-fetch command C4, the NANDC 14 maintains the command latch enable signal CLE in the active state, i.e., high (H) level. At the time of transmitting the address information ADD, the NANDC 14 maintains the address latch enable signal ALE in the active state, i.e., high (H) level. At the time of transmitting the data-out command set, the NANDC 14 toggles the write enable signal WEn.

The data-out command C3 serves to give an instruction as to the data-out operation. The address information ADD includes a column address and a row address. The column address indicates a head position of target data of the data-out operation in the one-page data stored in the data latch 25. The row address has the same value as the row address included in the sense command set.

The pre-fetch command C4 serves to give an instruction as to pre-fetch for the data-out operation. Target data of the data-out operation is divided in units of eight bits and data having an 8-bit width is output to the NANDC 14 from the data latch 25. The memory chip 21 pre-fetches for outputting the first 8-bit data among the target data of the data-out operation designated by the column address, in response to the pre-fetch command C4.

The NANDC 14 starts toggling the read enable signal pair RE/REn after elapse of time $t_{WHR2}$ from transmission of the pre-fetch command C4, specifically, from the toggling timing of the write enable signal WEn in response to the transmission of the pre-fetch command C4. The time $t_{WHR2}$ is predefined as a design value. The memory chip 21 generates the strobe signal pair DQS/DQSn by delaying the read enable signal pair RE/REn. The memory chip 21 outputs the generated strobe signal pair DQS/DQSn. The memory chip 21 outputs the target data of the data-out operation per eight bits from the data latch 25 to the IO signal line DQ[7:0] in synchronization with the strobe signal pair DQS/DQSn, starting from the head position designated by the column address. The NANDC 14 fetches the data from the memory chip 21 at the timing in synchronization with the strobe signal pair DQS/DQSn. As a result, the target data of the data-out operation is transferred from the memory chip 21 to the NANDC 14. That is, the data-out operation is executed.

The data-out operation is typically executed in units of clusters. A mode of the data-out operation executed in units of clusters is referred to as a cluster transfer mode.

A cluster represents data having a size of a unit of management by the memory controller 10. The management refers to management of the relationship between a logical address and a physical address, as one example.

The memory system 1 provides a logical address space for the host 2. The host 2 uses location information of the logical address space at the time of designating a location of access target data to the memory system 1. The location information of the logical address space is referred to as a logical address. The memory controller 10 maps a storage area of the NAND memory 20 to the logical address space. The address space including the storage area of the NAND memory 20 is referred to as a physical address space. Location information indicating one location in the physical address space is referred to as a physical address.

The relationship between the logical address space and the storage area of the NAND memory 20 is managed as translation information (translation information 131 as described later). Specifically, the logical address space is divided into a plurality of unit areas having the same size. In the translation information 131, the memory controller 10 stores the logical address, in each unit area of the logical address space, and the physical address in association with each other. The physical address partially includes a row address and a column address. The memory controller 10 updates the translation information 131 every time the relationship between the logical address and the physical address changes. The cluster refers to data in one unit area.

In the cluster transfer mode, a column address is transmitted in the data-out command set, indicating the location of a target cluster of the data-out operation. One-page data stored in the data latch 25 by a single sense operation may contain a plurality of target clusters of the data-out operation. In such a case, to read each of the plurality of target clusters of the data-out operation, the data-out command set is transmitted and the read enable signal pair RE/REn is toggled for each of the plurality of target clusters.

Consider that, for example, the first part of a read target cluster is stored in plane #0 and the second part of the read target cluster is stored in plane #1. In such a case, after the sense operations of a page including the first part of the read target cluster and a page including the second part of the read target cluster, the data-out operation of the first part and the data-out operation of the second part are to be carried out successively in this order. Such a cluster stored across two planes is referred to as a straddling cluster.

The constraint that the data-out operation of the first part of the read-target straddling cluster and the data-out operation of the second part of the read-target straddling cluster are to be carried out in this order arises from an error correction circuit (an error-correcting code (ECC) circuit 145, which will be described later) that requires data be input in units of ECC frames. In the present embodiment, the size of an ECC frame is the same as the size of a cluster.

Specifically, the ECC circuit 145 (or another component) encodes a cluster using an error correction code before transmitting the cluster to the memory chip 21. For error correction to the encoded cluster, the ECC circuit 145 is to receive the encoded cluster in order from the head thereof. Missing of data in the encoded cluster or changing in order of data in the encoded cluster may cause difficulty for the ECC circuit 145 in executing the error correction as expected. In the cluster transfer mode, the NANDC 14 receives data from the memory chip 21 and inputs the data to the ECC circuit 145 in the order of reception. Thus, as to the read target cluster stored across two planes, unless the data-out operation of the first part of the read target cluster and the data-out operation of the second part of the read target cluster are carried out in this order, the NANDC 14 cannot recover the original cluster in order from the head thereof and input the recovered cluster to the ECC circuit 145. This causes the constraint as above.

Thus, it is not allowed to execute the data-out operation to the first part and the data-out operation of the second part in a reverse order or to perform another operation (for example, data-out operation to another cluster) in-between them. In addition, the data latch 25 in plane #0 is to be occupied by the page including the first part of the read target cluster until completion of the data-out operation to the first part. For this reason, the NANDC 14 cannot execute a next sense operation in plane #0 until completion of the data-out operation to the first part of the read target cluster.

Likewise, the data latch 25 in plane #1 is to be occupied by the page including the second part of the read target cluster until completion of the data-out operation to the second part. For this reason, the NANDC 14 cannot execute a next sense operation in plane #1 until completion of the data-out operation to the second part of the read target cluster.

As described above, the straddling cluster to be read requires timing adjustment between the data-out operation to the first part of the cluster in one plane and the data-out operation to the second part of the cluster in another plane. Thus, the two planes, which are intrinsically operable independently to each other, are to be operated in cooperation with each other for the data-out operation to the straddling cluster. This may result in occurrence of a period in which the two planes are inoperable in parallel, causing deterioration in data transfer rate from the memory chip 21 to the memory controller 10.

In view of this, in the embodiment, the NANDC 14 is provided with a plurality of buffers (waiting buffers 147 as described later) capable of storing one-page data. The NANDC 14 is configured to be able to buffer one-page data stored in each of the data latches 25 of the two planes in two of the waiting buffers 147.

This makes it possible for plane #0 to proceed to a next operation, e.g., a sense operation to another page, without adjusting timing for the data-out operation to the second part of the read target cluster, by buffering the page including the first part of the read target cluster from the data latch 25 of plane #0 to one of the waiting buffers 147. Likewise, plane #1 can proceed to a next operation, e.g., a sense operation to another page, without adjusting timing for the data-out operation to the first part of the read target cluster, by buffering the page including the second part of the read target cluster from the data latch 25 of plane #1 to another one of the waiting buffers 147.

That is, plane #0 and plane #1 can be operated in parallel without timing adjustment between the data-out operation to the straddling cluster, which is a read target in both plane #0 and plane #1. This makes it possible to avoid deterioration in the data transfer rate from the memory chip 21 to the memory controller 10. An example of operating plane #0 and plane #1 in parallel will be described later.

In the embodiment, a page including a part of a read target cluster can be transferred from the data latch 25 to the waiting buffer 147 by a data-out operation on a page basis. A mode of the data-out operation executed in units of pages is referred to as a page transfer mode.

In the timing chart illustrated in FIG. 5, the NANDC 14 designates a size of target data of the data-out operation by the number of toggles of the read enable signal pair RE/REn. That is, in the cluster transfer mode, the NANDC 14 transfers data in units of clusters by toggling the read enable signal pair RE/REn by the number of times corresponding to the size of the cluster. In the page transfer mode, the NANDC 14 transfers data in units of pages by toggling the read enable signal pair RE/REn by the number of times corresponding to the size of the page. Note that a method for designating the data size for the data-out operation is not limited to the method using the number of toggles of the read enable signal pair RE/REn.

Figure 6:
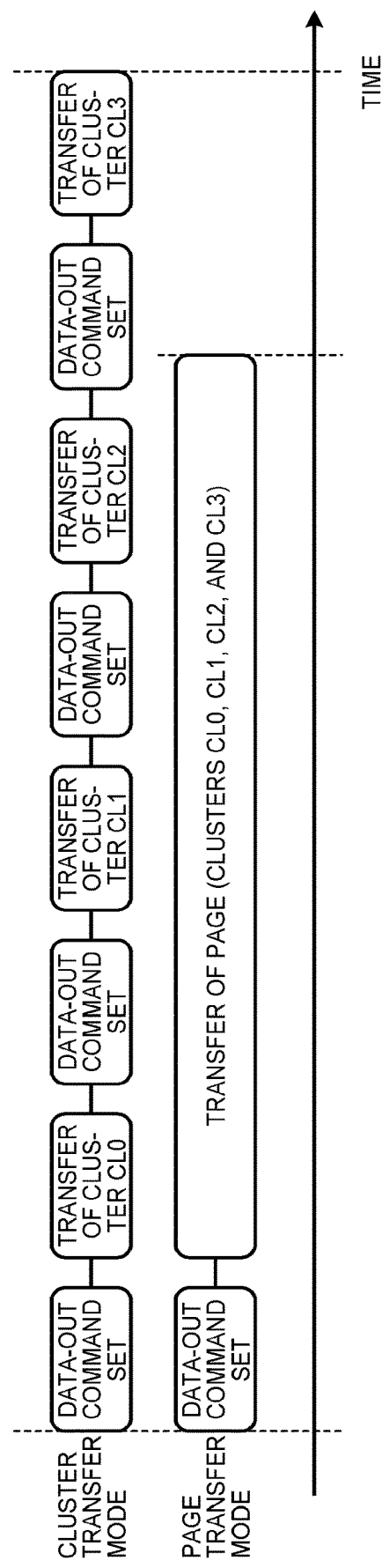
FIG. 6 is a view illustrating a difference between signals transferred through an IO signal line in a cluster transfer mode and a page transfer mode in the embodiment.

FIG. 6 is a view illustrating a difference between signals transferred through the IO signal line DQ[7:0] in the cluster transfer mode and the page transfer mode in the embodiment. The following describes an example that all of the four clusters CL0, CL1, CL2, and CL3 of a page are to be read.

In the cluster transfer mode, each of the clusters CL0, CL1, CL2, and CL3 is subjected to the data-out operation executed four times after the sense operation of the page in question. Specifically, the NANDC 14 transmits a data-out command set for the data-out operation to the cluster CL0, and then receives the cluster CL0 from the memory chip 21 by toggling the read enable signal pair RE/REn. The NANDC 14 transmits a data-out command set for the data-out operation to the cluster CL1 and then receives the cluster CL1 from the memory chip 21 by toggling the read enable signal pair RE/REn. The NANDC 14 transmits a data-out command set for the data-out operation to the cluster CL2 and then receives the cluster CL2 from the memory chip 21 by toggling the read enable signal pair RE/REn. The NANDC 14 transmits a data-out command set for the data-out operation to the cluster CL3 and then receives the cluster CL3 from the memory chip 21 by toggling the read enable signal pair RE/REn.

In the page transfer mode, all the four clusters CL0, CL1, CL2, and CL3 of the page are subjected to the data-out operation executed only once. Specifically, the NANDC 14 transmits a data-out command set for the data-out operation to the page in question and then receives the page, including four clusters CL0, CL1, CL2, and CL3, from the memory chip 21 by toggling the read enable signal pair RE/REn.

In the cluster transfer mode, the data-out command sets with different column addresses are transmitted for transferring the clusters of one page. The time taken for one transmission of the data-out command set is constant regardless of the transfer mode. For this reason, in the cluster transfer mode in which a plurality of data-out command sets are used, it takes a longer time to transmit the data-out command set than in the page transfer mode in which only one data-out command set is used. As for a page including a plurality of read target clusters, thus, it may take a shorter total time for the transmission of the command set and the data transfer in the page transfer mode than in the cluster transfer mode. As can be seen in the example illustrated in FIG. 6, the total time taken for transmission of the command set and for the data transfer is shorter in the page transfer mode for transferring one page including four clusters than in the cluster transfer mode for transferring the four clusters.

In the embodiment, the transfer mode is selected according to the number of read target clusters included in one page. An exemplary method for selecting the transfer mode will be described later.

The straddling cluster is considered to exist in various situations. The present embodiment describes an example of adopting an error correction code having a variable code rate used by the ECC circuit 145. The code rate refers to information obtained by dividing a size of data before encoding by a size of data after encoding. As the amount of parity data included in the encoded cluster increases, the code rate decreases, thereby increasing the size of the encoded cluster. Moreover, as the code rate decreases, the error correction capability improves.

Figure 7:
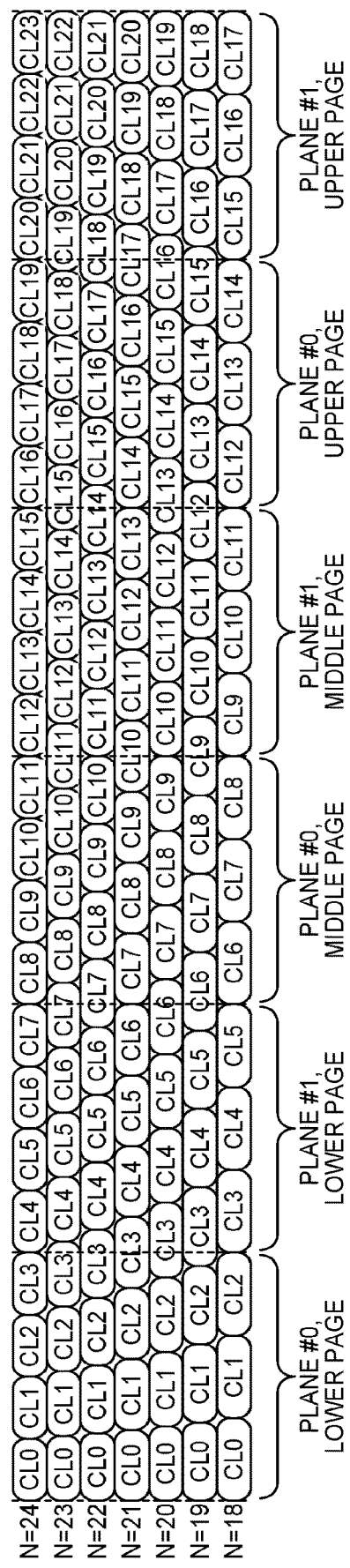
FIG. 7 is a schematic view illustrating locations of clusters stored in each plane in the memory system in the embodiment.

FIG. 7 is a schematic view illustrating the locations of clusters stored in plane #0 and plane #1 in the memory system 1 in the embodiment, which adopts an error correction code having a variable code rate. FIG. 7 illustrates an example of the locations of clusters stored in a logical storage area that includes six-page storage areas, that is, three pages (lower page, middle page, and upper page) in plane #0 and three pages (lower page, middle page, and upper page) in plane #1. This logical storage area is referred to as a super page.

At the left end of FIG. 7, the value N represents the maximum number of clusters that can be stored in a super page and corresponds to the code rate. As the code rate decreases, the encoded cluster increases in size and the value N, that is, the maximum number of clusters that can be stored in the super page, decreases. In the example illustrated in FIG. 7, the clusters each are assigned with an identifier (ID) represented by CLX where X is an integer from 0 to 23.

N clusters to be stored in one super page have the same size that is determined in accordance with the value N. Herein, the super page includes six-page storage areas, so that no straddling cluster exists as long as the value N is a multiple of 6. Conversely, a straddling cluster does exist unless the value N is a multiple of 6.

With the value N set to 24, for example, since 24 is a multiple of 6, no straddling cluster exists.

With the value N set to 23, for example, since 23 is not a multiple of 6, a straddling cluster exists. In the example illustrated in FIG. 7, a cluster CL3, a cluster CL7, a cluster CL11, a cluster CL15, and a cluster CL19 are stored across two planes #0 and #1.

With the value N set to 22, 21, 20, or 19, a straddling cluster exists. With the value N set to 18, no straddling cluster exists.

The value N is changeable at any timing. For example, the reliability of the memory cell array 22 may lower due to various factors. In response to a decrease in the reliability of the memory cell array 22, the memory controller 10 may decrease a currently set value of the code rate for encoding to further enhance the error correction capability. Herein, the code rate is changed by changing the value N. In one example, the initial value N is set to 24. The value N may be changed depending on the usage status of the memory cell array 22, an increase in the number of bits to be subjected to the error correction, or other criteria. The value N and a method for changing the value N are not limited to the examples described above.

Figure 8:
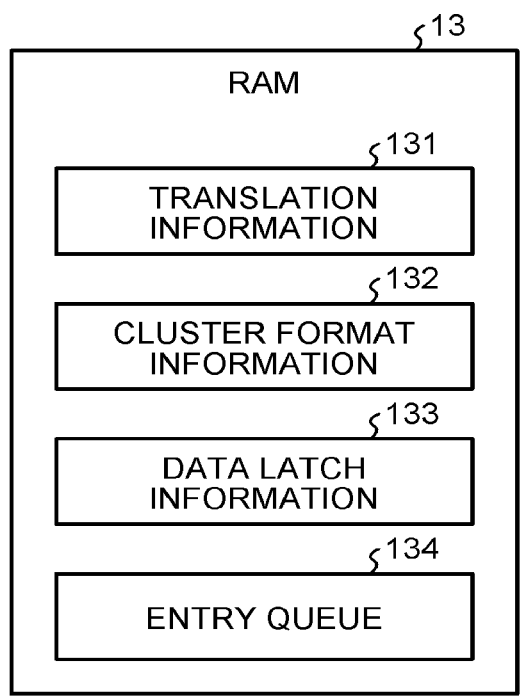
FIG. 8 is a schematic diagram illustrating an example of information stored in a RAM in the embodiment.

FIG. 8 is a schematic diagram illustrating an example of information stored in the RAM 13 in the embodiment. As illustrated in FIG. 8, the RAM 13 stores the translation information 131, cluster format information 132, and data latch information 133. In addition, the RAM 13 includes an entry queue 134.

As described above, the translation information 131 represents the relationship between the logical address and the physical address.

The cluster format information 132 indicates whether each cluster stored in a super page is a straddling cluster for each value N. The cluster format information 132 includes the size and the head column address of clusters other than the straddling cluster. The cluster format information 132 further includes the size and the head column address of the first part of the straddling cluster, and the size and the head column address (that is, zero) of the second part of the straddling cluster.

The data latch information 133 represents a group of information indicating pages stored in each data latch 25 of each memory chip 21. The data latch information 133 may have a data structure in a table format or a data structure different from the table format. The data latch information 133 is configured to allow the NANDC 14 to determine, by designating a memory chip 21 and a plane thereof, which page of data is stored in the data latch 25 of the designated plane of the designated memory chip 21. The data latch information 133 stores a physical address (row address) of the page as page information. The page information is not limited thereto.

The page information of a certain page is stored in the data latch information 133 at the timing at which the certain page is subjected to a sense operation, for example. In addition, the page information of a certain page is erased from the data latch information 133 at the timing at which write target data is stored in the data latch 25 which has stored data of the certain page. Alternatively, the page information of a certain page is erased from the data latch information 133 at the timing of a data erase operation is executed to the sub-array 23 in the same plane and the same memory chip 21 as the data latch 25 which stores data of the certain page. According to such an update rule, the data latch information 133 can reflect the latest status of each of the data latches 25. The update rule for the data latch information 133 is not limited thereto. The data latch information 133 may be updated from the latest status with some lag.

The entry queue 134 stores a first read command for execution of a read operation in units of clusters. In response to receipt of a read request from the host 2, for example, the memory controller 10 (more specifically, the CPU 11 for example) translates a logical address value contained in the read request into a physical address value in units of clusters using the translation information 131. If data requested by the read request contains a plurality of clusters, the memory controller 10 acquires the physical address value for each cluster. The memory controller 10 generates a first read command for each translated physical address value, that is, for each cluster of the plurality of clusters, and stores all the generated first read commands in the entry queue 134. Each of the first read commands contains the translated physical address value. The physical address value included in each of the first read commands indicates the location of a read target cluster.

The CPU 11 generates a second read command in units of clusters in accordance with the first read command stored in the entry queue 134. The second read command is an instruction for the NANDC 14 to cause the memory chip 21 to execute a read operation. The second read command includes a physical address value indicating the location of a read target cluster. The second read command is also added with information representing execution or non-execution of a sense operation. Specifically, the second read command includes the physical address value indicating the location of the read target cluster, a flag indicating whether to execute the sense operation, a straddle flag indicating whether the read target cluster is a straddling cluster, and a read mode flag indicating a read mode.

In the embodiment, the read mode includes, for example, two modes, a random read mode and a sequential read mode. The sequential read mode is designated for reading two or more clusters from one page, more specifically, one page of one plane. The random read mode is designated for not reading two or more clusters from one page, more specifically, one page of one plane. The read mode is not limited to the random read mode and the sequential read mode.

In response to the read mode flag indicating the random read mode, included in the second read command, the NANDC 14 executes a data-out operation in the cluster transfer mode. In response to the read mode flag indicating the sequential read mode, the NANDC 14 may execute a data-out operation in the page transfer mode.

The entry queue 134 may store another kind of command such as a write command, in addition to the first read command. Alternatively, another queue different from the entry queue 134 may store another kind of command. Hereinafter, only the first read command, i.e., no other commands, will be mentioned in connection with the entry queue 134.

Figure 9:
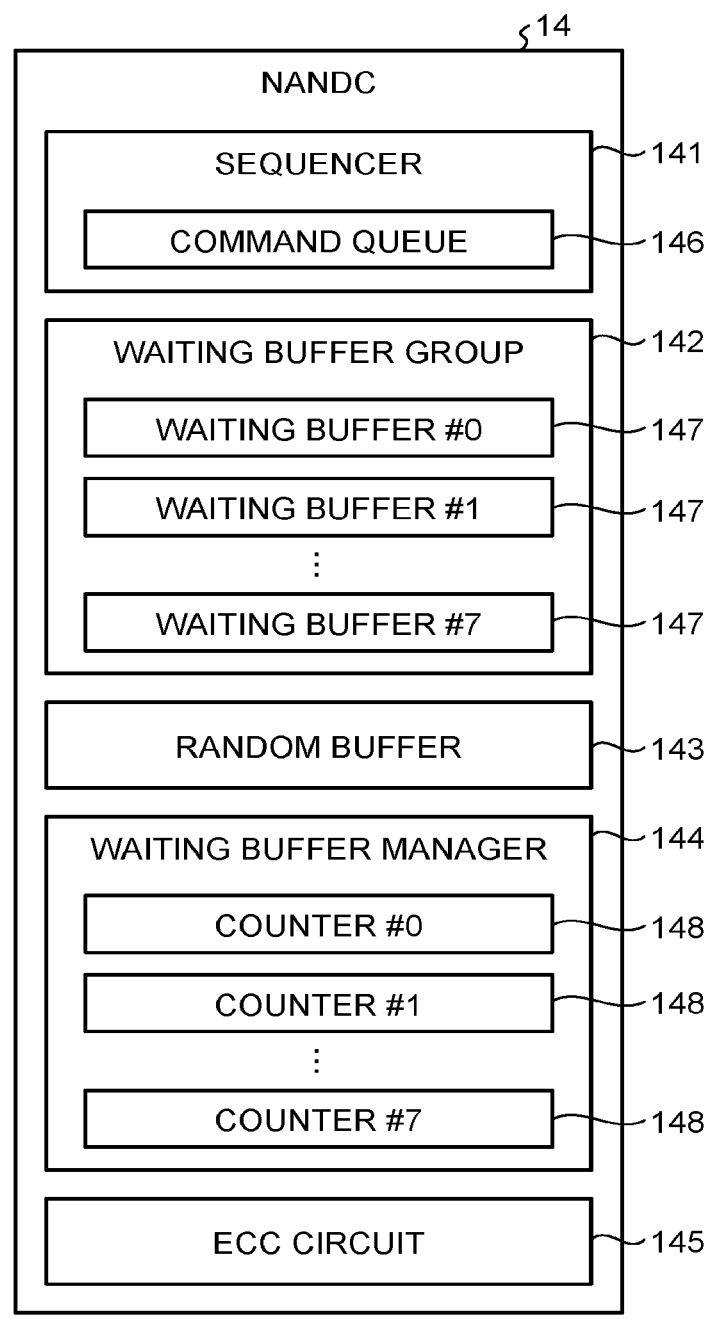
FIG. 9 is a schematic diagram illustrating an exemplary configuration of the NANDC in the embodiment.

FIG. 9 is a schematic diagram illustrating an exemplary detailed configuration of the NANDC 14 in the embodiment. The NANDC 14 includes a sequencer 141, a waiting buffer group 142, a random buffer 143, a waiting buffer manager 144, and an ECC circuit 145.

The sequencer 141 includes a command queue 146. The CPU 11 generates a second read command from the first read command and enqueues it in the command queue 146. That is, the CPU 11 generates a second read command from the first read command and stores the generated second read command in the command queue 146 of one of the two NANDCs 14, the one connected to the memory chip 21 storing a read target cluster.

The sequencer 141 selects one of one or more second read commands stored in the command queue 146 in accordance with availability of the channels, or, depending on the read mode flag, availability of the waiting buffer group 142 or the random buffer. The sequencer 141 can transmit a command set to the memory chip 21 or toggle the read enable signal line pair RE/REn according to the selected second read command.

The number of toggles of the read enable signal line pair RE/REn differs in the cluster transfer mode and in the page transfer mode. In response to the read mode flag of the second read command indicating the sequential read mode, the sequencer 141 selects the page transfer mode and toggles the read enable signal line pair RE/REn by the number of times corresponding to the page size. In response to the read mode flag of the second read command indicating the random read mode, the sequencer 141 selects the random read mode and toggles the read enable signal line pair RE/REn by the number of times corresponding to the cluster size.

The size of the cluster differs depending on the value N. The second read command stored in the command queue 146 is associated with information contained in the cluster format information 132 by any method. The sequencer 141 can know the value N and the size of the cluster, by referring to the cluster format information 132 in accordance with the second read command read from the command queue 146. In addition, as to a target cluster of data-out operation being a straddling cluster, the sequencer 141 can know a head column address and a size of the first part of the cluster as well as a head column address and a size of the second part of the cluster on the basis of the cluster format information 132.

A method for determining the value N and the size of the cluster by the sequencer 141 is not limited to the above example. The CPU 11 may record the value N and the size of the cluster in the second read command. As for a target cluster of the data-out operation being a straddling cluster, the CPU 11 may record the head column address and size of the first part of the cluster and the head column address and size of the second part of the cluster in the second read command.

The sequencer 141 may designate, to the waiting buffer group 142 or the random buffer 143, a storage location of data acquired by the data-out operation, instruct the waiting buffer group 142 or the random buffer 143 to store the data, or instruct the waiting buffer group 142 or the random buffer 143 to output the data to the ECC circuit 145. Hereinafter, a command for storing the data acquired by the data-out operation is referred to as a buffer storage command. A command for outputting the data to the ECC circuit 145 is referred to as a buffer output command.

The NANDC 14 includes a buffer manager (not illustrated) that controls data input and output to and from the waiting buffer group 142 or the random buffer 143. The sequencer 141 issues and transmits designation of the data storage location, the buffer storage command, and the buffer output command to the buffer manager. The buffer manager interprets the designated data storage location, the buffer storage command, and the buffer output command. Thereby, the buffer manager controls switching of the data storage location between the waiting buffers 147 and the random buffer 143, the storage of data in the data storage location, and the output of the data from the data storage location. Hereinafter, it is assumed that the waiting buffer group 142 and the random buffer 143 receive the designation of the data storage location, the buffer storage command, and the buffer output command from the sequencer 141, and execute operations in accordance with the received information, for the sake of simple explanation.

The waiting buffer group 142 includes a plurality of waiting buffers 147. Each waiting buffer 147 is constituted of, for example, an SRAM. As one example, the waiting buffer group 142 includes eight waiting buffers 147. Each of the waiting buffers 147 has a capacity of at least one page. That is, each of the waiting buffers 147 can store one-page data output to one data latch 25. By the data-out operation in the page transfer mode, one-page data is received from the memory chip 21 and stored in one of the eight waiting buffers 147, the one selected by the sequencer 141. The eight waiting buffers 147 are identified by buffer numbers zero to seven.

The random buffer 143 has a capacity of at least one cluster. The random buffer 143 is placed between the ECC circuit 145 and the channels. The random buffer 143 with the capacity of one or more clusters contributes to increasing the degree of freedom in terms of usage of the channels. The random buffer 143 is constituted of, for example, an SRAM. By the data-out operation in the cluster transfer mode, data of one cluster is transmitted from the memory chip 21 and stored in the random buffer 143.

The waiting buffer manager 144 serves to manage the availability of the eight waiting buffers 147. Specifically, the waiting buffer manager 144 includes eight counters 148 associated with the eight waiting buffers 147 one to one, to control the count values of the eight counters 148.

During execution of the second read command with the read mode flag indicating the sequential read mode, as described above, the data-out operation is executed in units of pages. Specifically, if any of the eight waiting buffers 147 stores a page including a target cluster of the data-out operation, the data-out operation is omitted, and the target cluster of the data-out operation is acquired from the waiting buffer 147 storing the page. If none of the eight waiting buffers 147 stores the page including the target cluster of the data-out operation, the data-out operation is executed in units of pages to acquire the page from the memory chip 21 and store the page in any of the eight waiting buffers 147. In such a case, the waiting buffer 147 in non-use is selected from among the eight waiting buffers 147 as a storage location of the page. The eight counters 148 are used to determine whether the corresponding waiting buffers 147 are being in use or in non-use.

The initial values of the eight counters 148 are set to zero. A certain counter 148 exhibiting count zero means that its corresponding waiting buffer 147 is being in non-use. In response to the second read command with the read mode flag indicating the sequential read mode, the waiting buffer manager 144 selects one waiting buffer 147 in non-use first. After start of the execution of the second read command, the waiting buffer manager 144 increments the count value of the counter 148 corresponding to the selected waiting buffer 147 by one. As a result, the selected waiting buffer 147 is placed in a state regarded as being in use. Then, the waiting buffer manager 144 acquires a page including a read target cluster indicated by the second read command from the memory chip 21, and stores the page in the selected waiting buffer 147.

In response to start of execution of the second read command with the read mode flag indicating the sequential read mode, that is, for acquiring another cluster from the same page as the page having been stored in the waiting buffer 147 that becomes in the state regarded as being in use, the waiting buffer manager 144 further increments the count value of the counter 148 corresponding to the waiting buffer 147 by one. The waiting buffer manager 144 reads and transmits the read target cluster indicated by the second read command from the waiting buffer 147 to the ECC circuit 145, instead of acquiring from the memory chip 21 through the data-out operation.

After completion of the output of the cluster from the waiting buffer 147 to the ECC circuit 145, the waiting buffer manager 144 decrements the count value of the corresponding counter 148 by one.

If, from the operation of the counter 148 as above, a page stored in the waiting buffer 147 is assumed to include a cluster to be output, the count value of the corresponding counter 148 is set to non-zero, placing the waiting buffer 147 in a use state. That is, the data in the waiting buffer 147 is protected from being overwritten by another page. If the page stored in the waiting buffer 147 is assumed to include no cluster to be output, the count value of the corresponding counter 148 is set to zero, placing the waiting buffer 147 in a non-use state, that is, the waiting buffer 147 is selectable to store another page.

The ECC circuit 145 receives the cluster encoded with the error correction code from the memory chip 21 and executes error correction to the cluster using the error correction code. A unit of data input to the ECC circuit 145 is referred to as the ECC frame. The ECC frame may or may not be the same as the cluster. The ECC frame different from the cluster includes a plurality of clusters. Herein, the ECC frame is equivalent to the cluster by way of example.

As described above, in response to execution of the second read command with the read mode flag indicating the sequential read mode, a page including the cluster designated by the second read command is received from the memory chip 21 and stored in any of the waiting buffers 147. The waiting buffer 147 then outputs a target cluster from the stored page to the ECC circuit 145 in accordance with the buffer output command from the sequencer 141. The sequencer 141 sends cluster information of the target cluster to the waiting buffer group 142 as the buffer output command. The cluster information represents whether the target cluster is a straddling cluster or not. In the case of a target cluster being a straddling cluster, the cluster information includes the size and the head column address of the first part of the straddling cluster as well as the size and the head column address of the second part of the straddling cluster.

In response to execution of the second read command with the read mode flag indicating the random read mode, the cluster designated by the second read command is received from the memory chip 21 and stored in the random buffer 143. The random buffer 143 then outputs a target cluster from the stored data to the ECC circuit 145 in accordance with a buffer output command from the sequencer.

After executing error correction to the input cluster, the ECC circuit 145 stores the cluster in a given location such as in the RAM 13. After the storage of the error-corrected cluster in the RAM 13, the CPU 11 may cause the host I/F 12 to transfer the cluster to the host 2.

In response to a failure of the error correction by the ECC circuit 145, the memory controller 10 may execute any processing. For example, the memory controller 10 may execute error correction with a higher correction capability to a cluster where the error correction has failed, or change a determination voltage and retry a read operation thereto.

The following will describe the operations of the memory system 1 in the embodiment.

Figure 10:
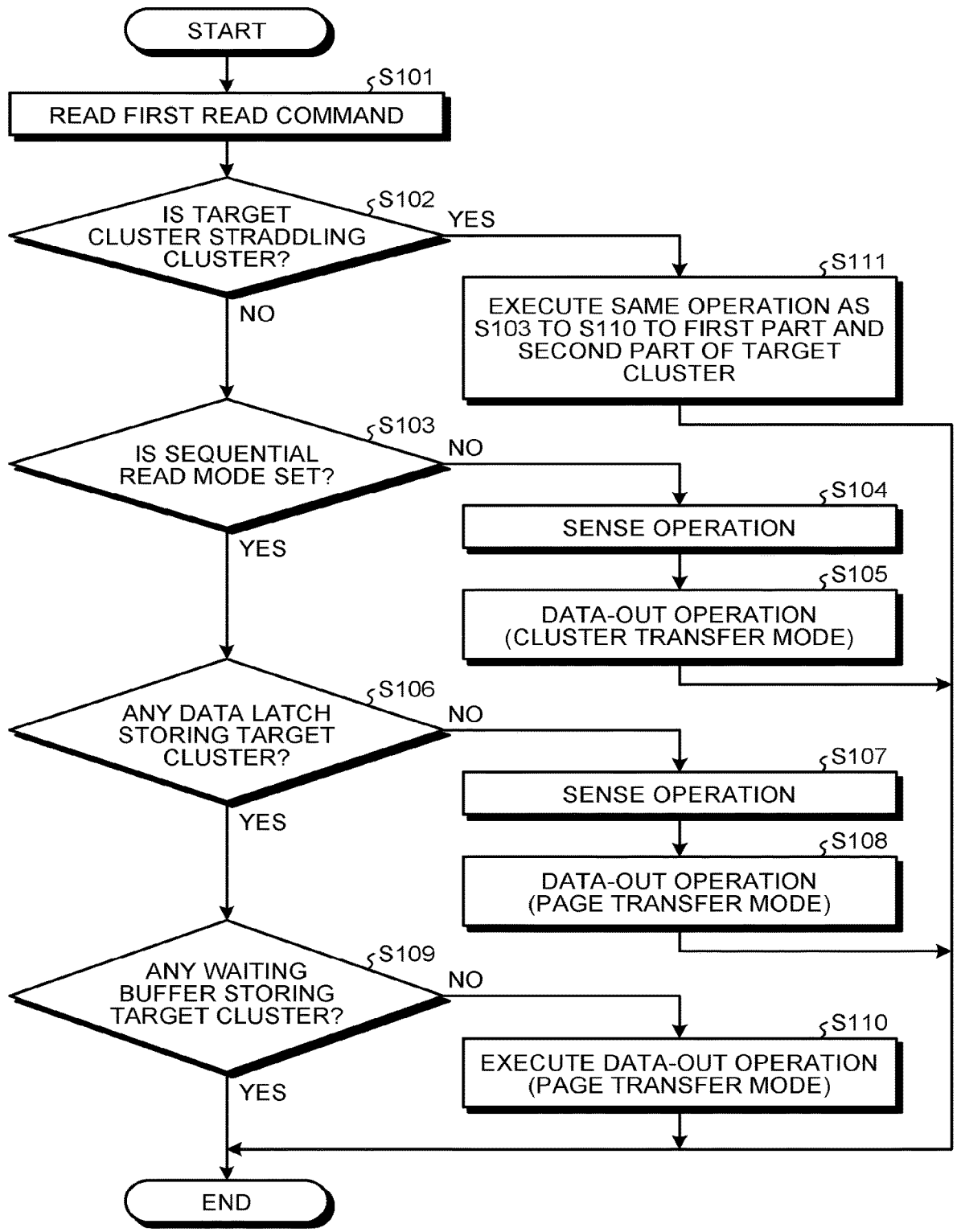
FIG. 10 is a flowchart illustrating an exemplary read operation in the memory system in the embodiment.

FIG. 10 is a flowchart illustrating an exemplary read operation in the memory system 1 in the embodiment. In FIG. 10, a series of operations is executed in response to each of the first read commands stored in the entry queue 134.

First, the CPU 11 reads one first read command from the entry queue 134 (S101). The CPU 11 determines whether a read target cluster indicated by the first read command is a straddling cluster (S102).

In a description with reference to FIG. 10, the first read command read in S101 is referred to as a target first read command. A read target cluster indicated by the target first read command is referred to as a target cluster.

The determination in S102 is not limited to by a particular method. For example, the CPU 11 determines whether a target cluster is a straddling cluster by referring to the cluster format information 132.

After determining the target cluster as the straddling cluster (YES in S102), the CPU 11 executes the operations of S103 to S110 to the first part and the second part of the target cluster (S111), ending the processing.

After determining the target cluster as not the straddling cluster (NO in S102), the CPU 11 determines whether to set the read mode for the target cluster to the sequential read mode (S103).

The determination in S103 is not limited to by a particular method. For example, the CPU 11 refers to physical address values recorded in all the first read commands stored in the entry queue 134 at the time of the determination of S103. The CPU 11 thus determines whether the entry queue 134 stores another first read command designating a cluster included in the same page of the target cluster (in other words, the same page that contains the target cluster in the same plane). After determining that the entry queue 134 stores another first read command designating a cluster included in the same page of the target cluster, the CPU 11 sets the read mode for the target cluster to the sequential read mode. The CPU 11 may also determine to set the read mode for a read target cluster of said another first read command to the sequential read mode.

After determining that the entry queue 134 includes no other first read command designating a cluster included in the same page of the target cluster, the CPU 11 sets the read mode for the target cluster to the random read mode instead of the sequential read mode.

With a target cluster being a straddling cluster found, the read modes for the first part and the second part of the target cluster are set to the same read mode.

After determining to set the read mode for the target cluster not to the sequential read mode (NO in S103) but to the random read mode, the CPU 11 enqueues a second read command with a flag indicating execution of a sense operation and a read mode flag indicating the random read mode into the command queue 146 of the NANDC 14. With the target cluster as a straddling cluster found, the CPU 11 further adds a straddle flag to the second read command. In accordance with the second read command, the NANDC 14 executes the sense operation (S104) and the data-out operation in the cluster transfer mode (S105), ending the data transfer operation.

With the target cluster as not a straddling cluster found and the read modes for the first part and the second part of the target cluster set to the random read mode, the memory controller 10 is required to execute the data-out operation to the first part of the target cluster and the data-out operation to the second part of the target cluster in this order. To cause the NANDC 14 to comply with this constraint, the CPU 11 may be configured to instruct the NANDC 14 to read the first part and the second part of the target cluster by a single second read command. That is, in response to the sequencer 141's selecting the second read command from the command queue 146, the NANDC 14 executes the data-out operation to the first part of the target cluster and the data-out operation to the second part of the target cluster in this order. As long as the NANDC 14 can comply with the constraint, the CPU 11 may not instruct the NANDC 14 to read the first part and the second part by one second read command.

With the read mode for the target cluster set to the sequential read mode (YES in S103), the CPU 11 determines whether any of the data latches 25 stores the target cluster (S106). The CPU 11 makes the determination in S106 on the basis of the data latch information 133.

With no data latch 25 storing the target cluster found (NO in S106), the CPU 11 enqueues a second read command with a flag indicating execution of a sense operation and a read mode flag indicating the sequential read mode into the command queue 146 of the NANDC 14. After determining the target cluster as a straddling cluster, the CPU 11 further adds a straddle flag to the second read command. In accordance with the second read command, the NANDC 14 executes the sense operation (S107) and the data-out operation in the page transfer mode (S108), ending the data transfer operation.

In the case of the target cluster being a straddling cluster and in the sequential read mode set, the NANDC 14 executes the data-out operation to the page including the first part of the target cluster and the page including the second part of the target cluster in any order, unlike in the case of the target cluster being a straddling cluster and in the random read mode set. That is, the CPU 11 may instruct the NANDC 14 to read the first part and the second part of the target cluster by different second read commands. Even in this case, the CPU 11 may instruct the NANDC 14 to read the first part and the second part of the target cluster by one second read command.

After determining that the target cluster is stored in any of the data latches 25 (YES in S106), the CPU 11 enqueues a second read command with a flag indicating non-execution of a sense operation and a read mode flag indicating the sequential read mode into the command queue 146 of the NANDC 14. With the target cluster as a straddling cluster found, the CPU 11 further adds a straddle flag to the second read command.

In executing the second read command with the flag indicating non-execution of the sense operation and the read mode flag indicating the sequential read mode, the NANDC 14 determines whether any of the waiting buffers 147 stores the target cluster (S109). After finding the waiting buffer 147 storing the target cluster (YES in S109) the NANDC 14 refrains from executing the data-out operation and ends the data transfer operation.

After finding no waiting buffer 147 storing the target cluster (NO in S109), the NANDC 14 executes the data-out operation in the page transfer mode (S110), ending the data transfer operation.

In the sense operation in S104 and S107, the page read from the sub-array 23 is stored in the data latch 25 of the plane subjected to the sense operation. That is, the CPU 11 updates the data latch information 133 in response to the execution of the sense operation in S104 and S107. In the data erase operation or the write operation, the data in the data latch 25 of the plane subjected to the data erase operation or the write operation is overwritten, therefore, the CPU 11 updates the data latch information 133 in response to the execution of the data erase operation or the write operation. As a result, the data latch information 133 can reflect the latest status of each of the data latches 25.

In addition, in the series of operations illustrated in FIG. 10, the determination on presence of the data latch 25 storing the target cluster (S106) and the determination on presence of the waiting buffer 147 storing the target cluster (S109) are executed in this order, because of the following reasons. The data latch information 133 constantly reflects the latest status of each of the data latches 25, which allows the CPU 11 to make the determination in S106 in accordance with the latest status of each of the data latches 25. Meanwhile, the data in the respective waiting buffers 147 is not overwritten by executing the data erase operation or the write operation. That is, the waiting buffers 147 do not constantly store a page reflecting the latest status. Through the sequential determinations in S106 and S109, the memory system 1 can determine whether to perform the data-out operation in the page transfer mode according to the latest status of each of the data latches 25.

FIGS. 11 to 14 are views illustrating details of the operation of the NANDC 14 in the embodiment.

Figure 11:
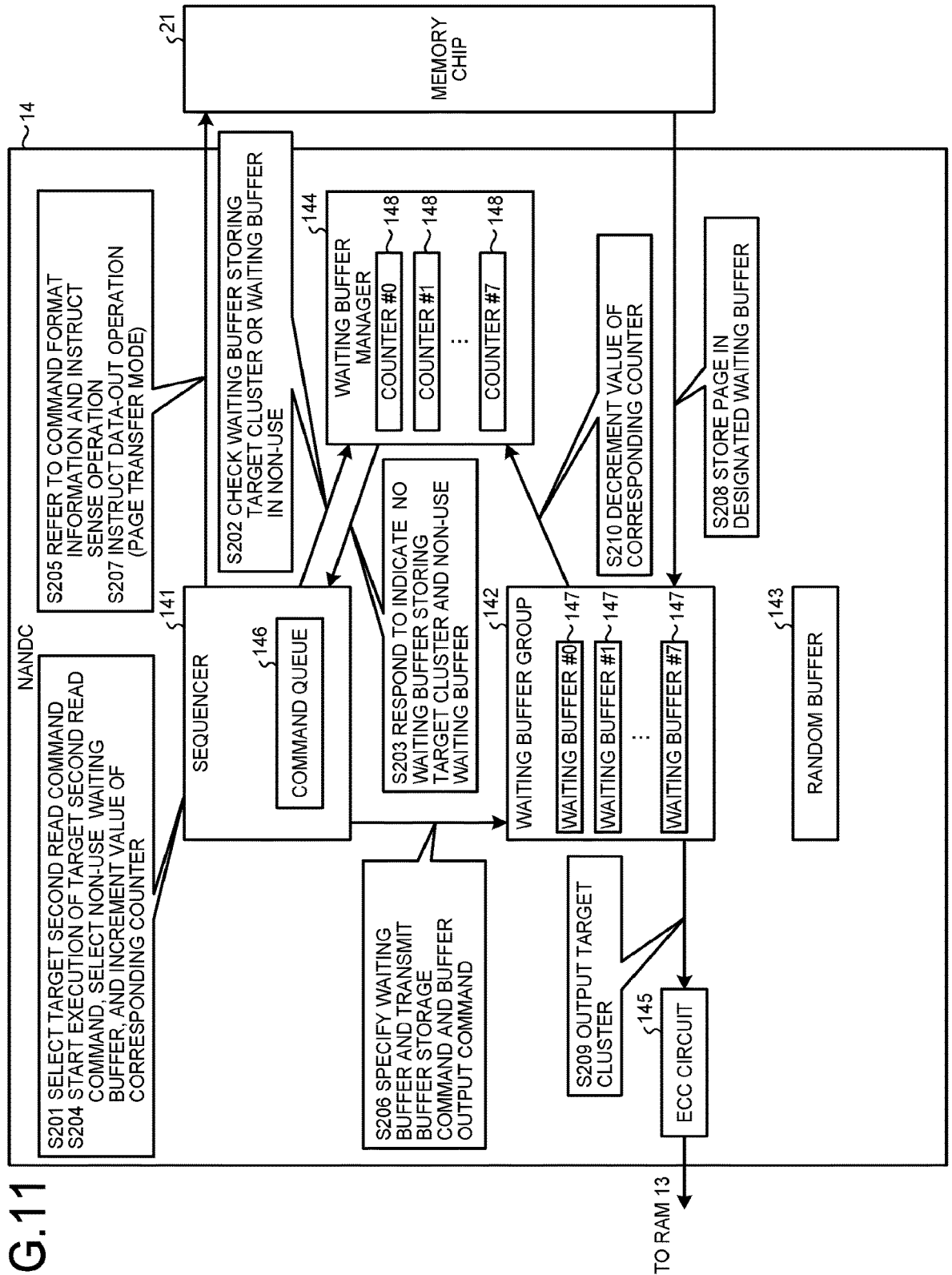
FIG. 11 is a view illustrating an exemplary operation of executing a second read command issued after determining no data latch storing a target cluster.

FIG. 11 illustrates an exemplary operation of executing a second read command issued by the CPU 11 after determining no data latch 25 storing the target cluster in the S106 illustrated in FIG. 10. The second read command is added with a flag indicating execution of a sense operation and a read mode flag indicating the sequential read mode. This second read command is also added with a straddle flag if a target cluster is a straddling cluster. In a description with reference to FIG. 11, this second read command is referred to as a target second read command. Also in a description with reference to FIG. 11, a read target cluster indicated by the target second read command is referred to as a target cluster.

After selecting a target second read command from one or more second read commands stored in the command queue 146 (S201), the sequencer 141 first refers to the read mode flag to confirm that the sequential read mode is set, and inquires the waiting buffer manager 144 of whether any of the waiting buffers 147 stores the target cluster or is in non-use (S202). The sequencer 141 may omit the inquiry about presence of the waiting buffer 147 storing the target cluster. The waiting buffer manager 144 sends to the sequencer 141 a response that none of the waiting buffers 147 contains the target cluster (S203). After finding the counter 148 exhibiting the count value of zero, the waiting buffer manager 144 sends to the sequencer 141 a response indicating one of the waiting buffers 147 corresponding to the counter 148 as the waiting buffer 147 in non-use (S203).

In response to receipt of the response as to the non-use waiting buffer 147 from the waiting buffer manager 144, the sequencer 141 starts executing the target second read command. Specifically, the sequencer 141 first selects the non-use waiting buffer 147 notified from the waiting buffer manager 144 as a page storage location and notifies the waiting buffer manager 144 of the selection. The waiting buffer manager 144 increments the count value of the counter 148 corresponding to the selected waiting buffer 147 by one (S204).

Subsequently, the sequencer 141 acquires information required for execution of the target second read command from the cluster format information 132, and instructs the memory chip 21 to execute the sense operation (S205). That is, the sequencer 141 transmits a sense command set. After the memory chip 21 starts the sense operation, the ready busy signal line R/Bn transitions from the ready state to the busy state. After completion of the sense operation in the memory chip 21, the ready busy signal line R/Bn transitions from the busy state to the ready state.

The sequencer 141 monitors the ready busy signal line R/Bn. From the transition of the ready busy signal line R/Bn from the busy state to the ready state, the sequencer 141 can know the completion of the sense operation in the memory chip 21. Then, the sequencer 141 transmits, to the waiting buffer group 142, designation of the waiting buffer 147 as the page storage location, the buffer storage command for storing the page in the designated waiting buffer 147, and the buffer output command for outputting the target cluster to the ECC circuit 145 (S206). The sequencer 141 instructs the data-out operation in the page transfer mode (S207). That is, the sequencer 141 sends, to the memory chip 21, the data-out command set that includes a column address indicating the head of the page including the target cluster, and toggles the read enable signal pair RE/REn by the number of times corresponding to the size of the page.

After the NANDC 14 receives the page from the memory chip 21 with the strobe signal pair DQS/DQSn, the waiting buffer group 142 executes an operation based on the buffer storage command and the buffer output command to the waiting buffer 147 designated by the sequencer 141 in S206. That is, the page received from the memory chip 21 is stored in the waiting buffer 147 of the waiting buffer group 142 designated by the sequencer 141 (S208). At the timing when the ECC circuit 145 becomes ready to execute an operation, the waiting buffer 147 outputs the target cluster from the page stored therein to the ECC circuit 145 (S209). After completion of S209, the waiting buffer group 142 notifies the waiting buffer manager 144 of the waiting buffer 147 having output the target cluster. The waiting buffer manager 144 decrements the count value of the corresponding counter 148 by one in response to the notification (S210).

The ECC circuit 145 may execute error correction to the input target cluster and store the error-corrected target cluster, for example, in the RAM 13.

In the example illustrated in FIG. 11, a non-use waiting buffer 147 is present. With no waiting buffer 147 in non-use found, that is, no counter 148 exhibiting a count value of zero at the time of the sequencer 141's inquiry to the waiting buffer manager 144, the waiting buffer manager 144 sends to the sequencer 141 a response that none of the waiting buffers 147 is in non-use, that is, all the waiting buffers 147 are in use. Then, the sequencer 141 postpones the execution of the target second read command, and selects, as a new target command, another command stored in the command queue 146, for example, a command for an operation not requiring the waiting buffer 147 in non-use. As one example, the sequencer 141 may select the second read command with a read mode flag indicating the random read mode as the new target command, if any.

Figure 12:
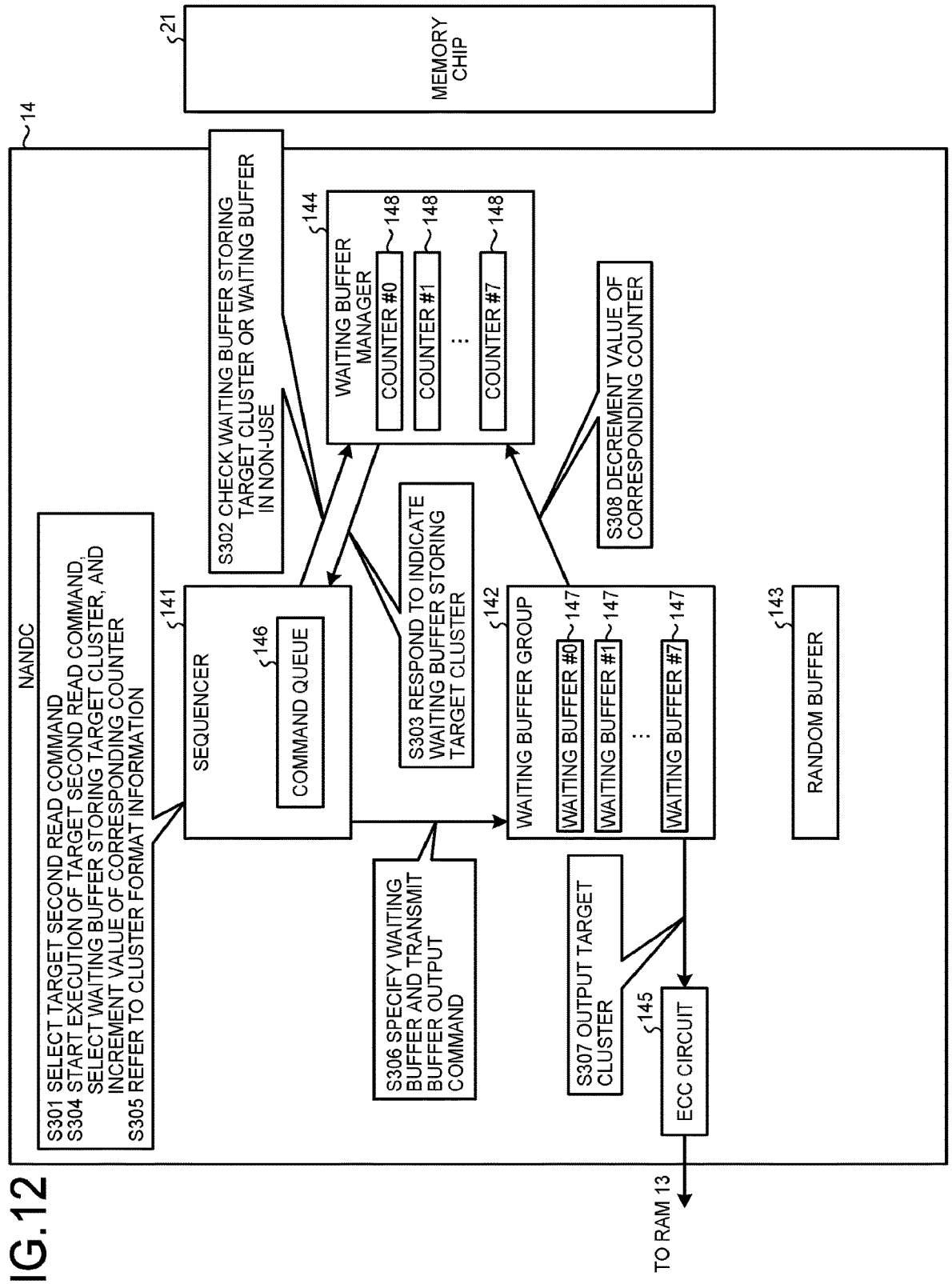
FIG. 12 is a view illustrating an exemplary operation of executing the second read command issued after determining presence of data latch storing the target cluster

FIG. 12 illustrates an exemplary operation of executing a second read command issued by the CPU 11 after determining presence of the data latch 25 storing the target cluster in S106 of FIG. 10. This second read command is added with a flag indicating non-execution of a sense operation and a read mode flag indicating the sequential read mode. The second read command is also added with a straddle flag if a target cluster is a straddling cluster. In a description with reference to FIG. 12, the second read command is referred to as a target second read command. Also in a description with reference to FIG. 12, a read target cluster indicated by the target second read command is referred to as a target cluster.

After selecting the target second read command from one or more second read commands stored in the command queue 146 (S301), the sequencer 141 first refers to the read mode flag to confirm that the sequential read mode is set, and inquires the waiting buffer manager 144 of whether any of the waiting buffers 147 stores the target cluster or is in non-use (S302). With the waiting buffer 147 storing the target cluster found, the waiting buffer manager 144 sends a response indicating the waiting buffer 147 storing the target cluster to the sequencer 141 (S303).

In response to receipt of the response indicating the waiting buffer 147 storing the target cluster from the waiting buffer manager 144, the sequencer 141 starts executing the target second read command. Specifically, the sequencer 141 first selects the waiting buffer 147 indicated by the response from the waiting buffer manager 144 and notifies the waiting buffer manager 144 of the waiting buffer 147 in question. The waiting buffer manager 144 increments the count value of the counter 148 corresponding to the selected waiting buffer 147 by one (S304).

Subsequently, the sequencer 141 acquires information required for execution of the target second read command from the cluster format information 132 (S305) The sequencer 141 transmits, to the waiting buffer group 142, designation of the waiting buffer 147 storing the target cluster and the buffer output command (including cluster information) for outputting the target cluster to the ECC circuit 145 (S306).

The waiting buffer group 142 executes an operation based on the buffer output command to the waiting buffer 147 designated by the sequencer 141 in S306. That is, at the timing when the ECC circuit 145 becomes ready to execute an operation, the designated waiting buffer 147 inputs the target cluster from the page stored therein to the ECC circuit 145 (S307). After completion of S307, the waiting buffer group 142 notifies the waiting buffer manager 144 of the waiting buffer 147 having output the target cluster. The waiting buffer manager 144 decrements the count value of the corresponding counter 148 by one in response to the notification.

The ECC circuit 145 may execute error correction to the input target cluster and store the error-corrected target cluster, for example, in the RAM 13.

In the example illustrated in FIG. 12, the waiting buffer 147 storing the target cluster is present. The following will describe an operation in the case of no waiting buffer 147 storing the target cluster with reference to FIG. 13.

Figure 13:
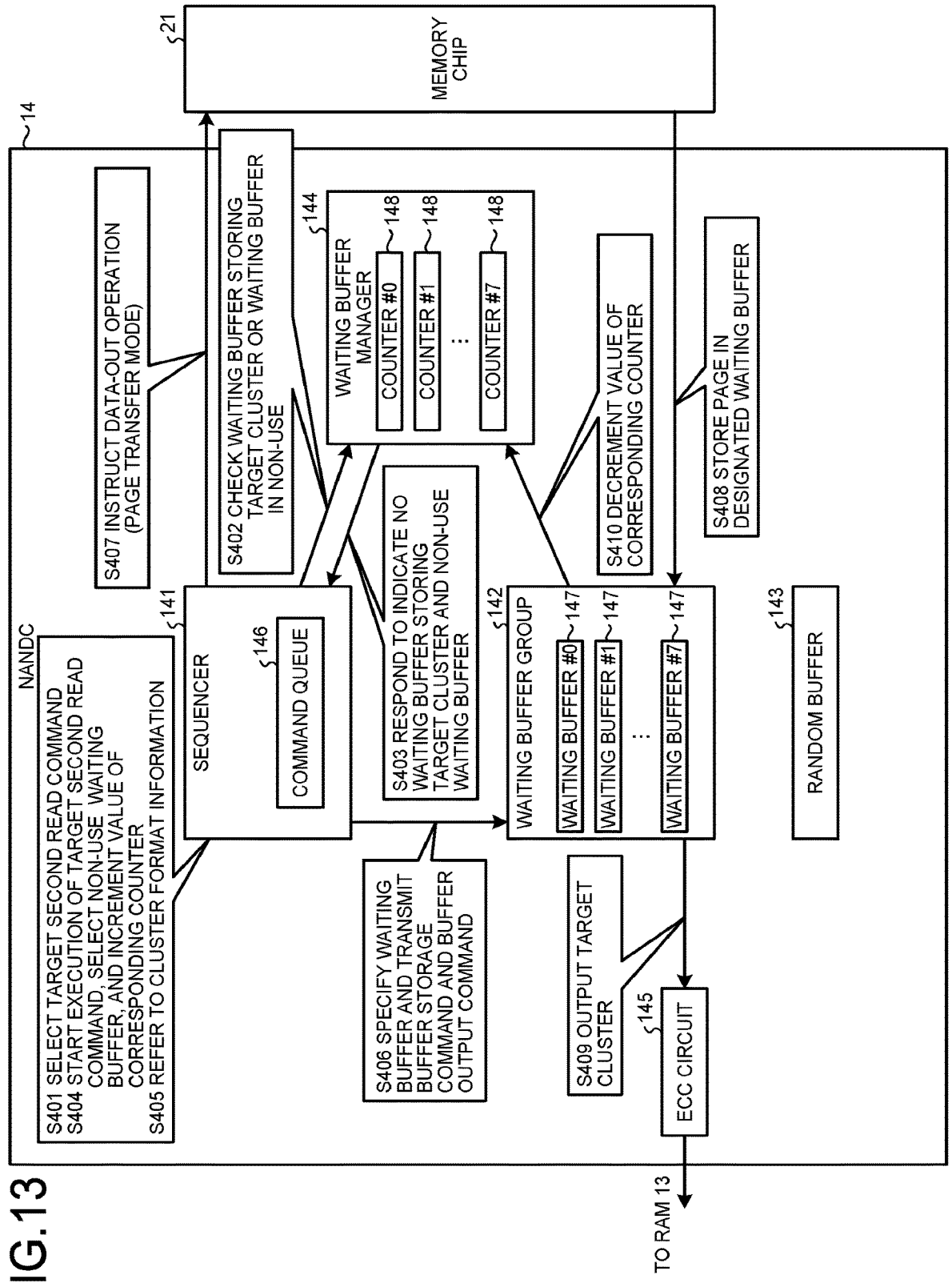
FIG. 13 is a view illustrating another example of an operation of executing the second read command issued after determining presence of the data latch storing the target cluster.

FIG. 13 illustrates another exemplary operation of executing the second read command issued by the CPU 11 after determining that none of the data latch 25 stores the target cluster in S106 of FIG. 10. This second read command is added with a flag indicating non-execution of a sense operation and a read mode flag indicating the sequential read mode. The second read command is also added with a straddle flag if a target cluster is a straddling cluster. In a description with reference to FIG. 13, the second read command is referred to as a target second read command. Also in a description with reference to FIG. 13, a read target cluster indicated by the target second read command is referred to as a target cluster.

After selecting the target second read command from one or more second read commands stored in the command queue 146 (S401), the sequencer 141 first refers to the read mode flag to confirm that the sequential read mode is set, and inquires the waiting buffer manager 144 of whether any of the waiting buffers 147 stores the target cluster or is in non-use (S402). With no waiting buffer 147 storing the target cluster found, the waiting buffer manager 144 sends a response that none of the waiting buffers 147 stores the target cluster. In addition, with no waiting buffer 147 storing the target cluster found, the waiting buffer manager 144 determines whether any of the waiting buffers 147 is in non-use. After the non-use waiting buffer 147 is found, the waiting buffer manager 144 informs the sequencer 141 of the non-use waiting buffer 147. In this example, the waiting buffer manager 144 informs the sequencer 141 of absence of the waiting buffer 147 storing the target cluster and presence of the non-use waiting buffer 147 (S403).

In response to receipt of the response indicating no waiting buffer 147 storing the target cluster and presence of the non-use waiting buffer 147, the sequencer 141 starts executing the target second read command. Specifically, the sequencer 141 first selects the non-use waiting buffer 147 informed from the waiting buffer manager 144 as a page storage location and notifies the waiting buffer manager 144 of the selection. The waiting buffer manager 144 increments the count value of the counter 148 corresponding to the selected waiting buffer 147 by one (S404).

Subsequently, the sequencer 141 acquires information required for execution of the target second read command from the cluster format information 132 (S405) The sequencer 141 transmits, to the waiting buffer group 142, designation of the waiting buffer 147 as the page storage location, the buffer storage command for storing the page in the designated waiting buffer 147, and the buffer output command for outputting the target cluster to the ECC circuit 145 (S406).

The sequencer 141 instructs the memory chip 21 to perform the data-out operation in the page transfer mode (S407). That is, the sequencer 141 sends, to the memory chip 21, the data-out command set that includes a column address indicating the head of the page, and toggles the read enable signal pair RE/REn by the number of times corresponding to the size of the page.

After the NANDC 14 receives the page from the memory chip 21 with the strobe signal pair DQS/DQSn, the waiting buffer group 142 executes an operation based on the buffer storage command and the buffer output command to the waiting buffer 147 designated by the sequencer 141 in S406. That is, the page received from the memory chip 21 is stored in the waiting buffer 147 of the waiting buffer group 142 designated by the sequencer 141 (S408). Then, at the timing when the ECC circuit 145 becomes ready to execute an operation, the waiting buffer 147 outputs the target cluster from the page stored therein to the ECC circuit 145 (S409). After completion of S409, the waiting buffer group 142 notifies the waiting buffer manager 144 of the waiting buffer 147 having output the target cluster. The waiting buffer manager 144 decrements the count value of the counter 148 corresponding to the waiting buffer 147 having output the target cluster by one in response to the notification (S410).

The ECC circuit 145 may execute error correction to the input target cluster and store the error-corrected target cluster, for example, in the RAM 13.

FIG. 13 illustrates the example that the non-use waiting buffer 147 is present. In the case of no waiting buffer 147 in non-use, that is, no counter 148 exhibiting a count value of zero at the time of the sequencer 141's sending the inquiry to the waiting buffer manager 144, the waiting buffer manager 144 sends to the sequencer 141 a response that none of the waiting buffers 147 is in non-use, that is, all the waiting buffers 147 are in use. Then, the sequencer 141 postpones the execution of the target second read command, and selects, as a new target command, another command stored in the command queue 146, for example, a command for an operation not requiring the waiting buffer 147 in non-use. In one example, the sequencer 141 may select the second read command with the read mode flag indicating the random read mode as the new target command, if any.

Figure 14:
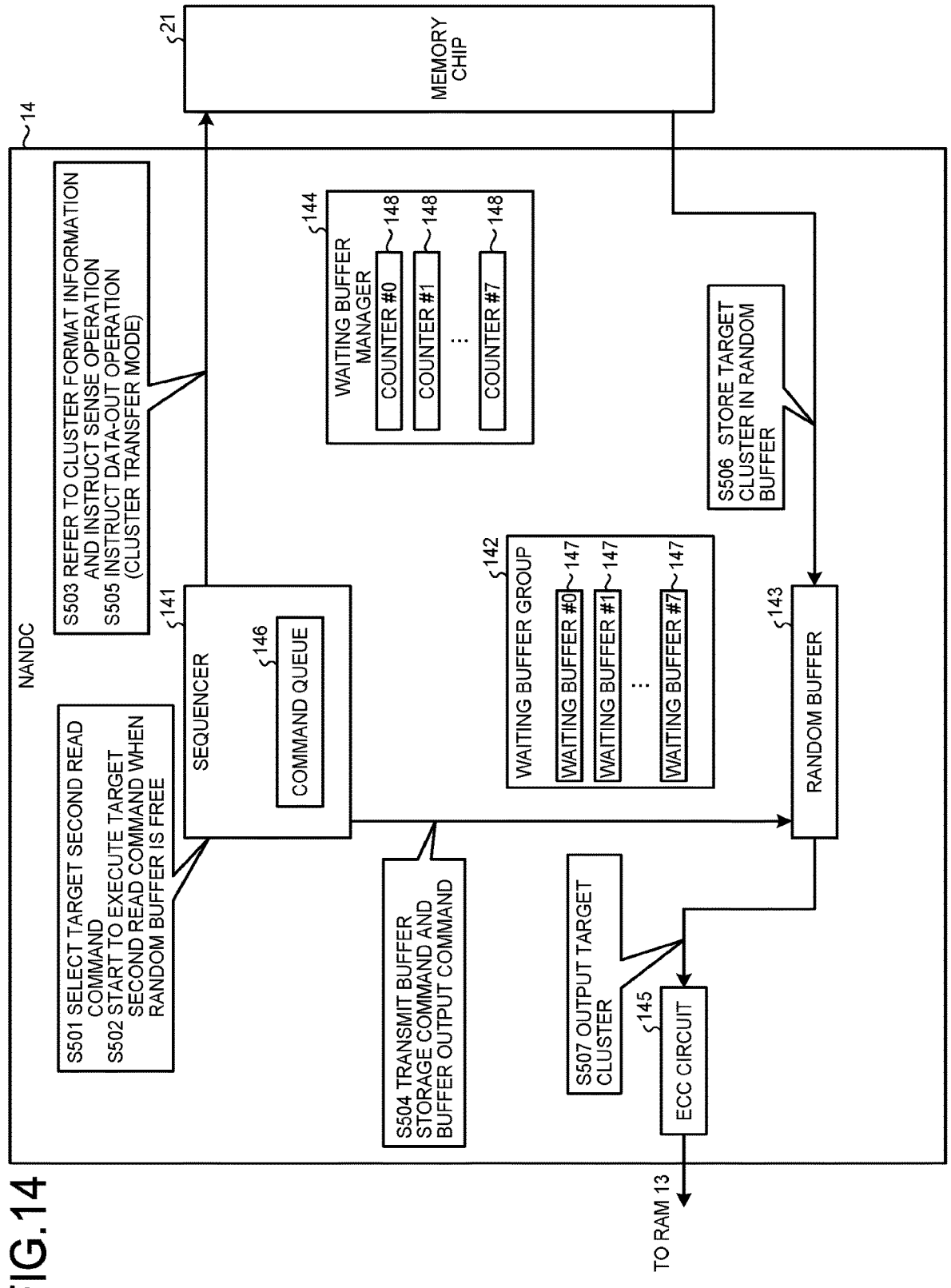
FIG. 14 is a view illustrating an exemplary operation of executing the second read command issued after determining to set the read mode for the target cluster to a random read mode.

FIG. 14 illustrates an exemplary operation of executing a second read command issued by the CPU 11 after determining to set the read mode for a target cluster to the random read mode in S103 of FIG. 10. This second read command is added with a flag indicating execution of a sense operation and a read mode flag indicating the random read mode. In addition, the second read command is added with a straddle flag if a target cluster is a straddling cluster. In a description with reference to FIG. 14, the second read command is referred to as a target second read command. Also in a description with reference to FIG. 14, a read target cluster indicated by the target second read command is referred to as a target cluster.

After selecting the target second read command from one or more second read commands stored in the command queue 146 (S501), the sequencer 141 first determines whether the random buffer 143 is free (i.e., available). A method for determining whether the random buffer 143 is free is not limited to a particular method. As one example, the random buffer 143 constantly transmits information indicating availability of the random buffer 143 to the sequencer 141. The sequencer 141 receives the information from the random buffer 143 and determines the availability of the random buffer 143 on the basis of the information. The random buffer 143 being free means that the random buffer 143 includes, for example, available space for storing one cluster.

In the case of the random buffer 143 being free, the sequencer 141 starts executing the target second read command (S502). Specifically, the sequencer 141 first acquires information required for execution of the target second read command from the cluster format information 132, and instructs the memory chip 21 to execute the sense operation (S503). That is, the sequencer 141 transmits a sense command set. After the memory chip 21 starts the sense operation, the ready busy signal line R/Bn transitions from the ready state to the busy state. After the memory chip 21 completes the sense operation, the ready busy signal line R/Bn transitions from the busy state to the ready state.

After recognizing the completion of the sense operation in the memory chip 21 on the basis of the ready busy signal line R/Bn, the sequencer 141 transmits, to the random buffer 143, the buffer storage command for storing the target cluster and the buffer output command for outputting the target cluster to the ECC circuit 145 (S504) Then, the sequencer 141 instructs the memory chip 21 to perform the data-out operation in the cluster transfer mode (S505). That is, the sequencer 141 sends, to the memory chip 21, the data-out command set that includes a column address indicating the head of the target cluster, and toggles the read enable signal pair RE/REn by the number of times corresponding to the size of the target cluster.

After the NANDC 14 receives the target cluster, the random buffer 143 executes an operation based on the buffer storage command and the buffer output command received from the sequencer 141 in S504. That is, the target cluster received from the memory chip 21 is stored in the random buffer 143 (S506). The random buffer 143 outputs the stored target cluster to the ECC circuit 145 at the timing when the ECC circuit 145 becomes ready to execute an operation (S507).

The ECC circuit 145 may execute error correction to the input target cluster and store the error-corrected target cluster, for example, in the RAM 13.

Regarding the sequential read mode for a straddling cluster, for example, the CPU 11 generates different second read commands for the first part and the second part of the straddling cluster and store the second read commands in the command queue 146. The NANDC 14 executes any of the operations illustrated in FIGS. 11 to 13 in response to each of the second read commands for the first part and the second part of the straddling cluster. However, the first part and the second part of the target cluster are output in this order from the waiting buffer group 142 to the ECC circuit 145. The NANDC 14 adjusts the timing at which the first part and the second part of the target cluster are output from the waiting buffer group 142, to output the parts in the correct order.

Regarding the random read mode for a straddling cluster, for example, the CPU 11 generates one second read command for designating the first part and the second part of the straddling cluster as read targets and store the one second command in the command queue 146. In executing the second read command, the NANDC 14 executes the operation of S503 in FIG. 14 to each of the first part and the second part of the target cluster. Then, the NANDC 14 executes the operation of S504 only once. The NANDC 14 executes the operations from S505 to S506 to first the first part and then to the second part of the target cluster. As a result, the first part and the second part of the target cluster are combined together in the random buffer 143. The NANDC 14 then executes the operation of S507.

FIG. 15 is a view illustrating a method for managing the waiting buffer group 142 in the embodiment. The following will describe an example of sequentially setting the cluster CL1 to the cluster CL6 as read targets by the first read command when the value N is set to 23 in the example illustrated in FIG. 7. The cluster CL3 is a straddling cluster and is divided into a first part (denoted as a cluster CL3a) stored in the lower page of plane #0 and a second part (denoted as a cluster CL3b) stored in the lower page of plane #1.

The NANDC 14 receives an instruction to read each of the cluster CL1 to the cluster CL6 by the second read command with the read mode flag indicating the sequential read mode determined in S103 of FIG. 10. The straddle flag is added to the second read command for setting the cluster CL3 as the read target.

At the time of start of reading the cluster CL1 to the cluster CL6, among the plurality of waiting buffers 147, the waiting buffer #0 and the waiting buffer #1 are not in use, that is, the count values of the counters 148 corresponding thereto are zero.

As illustrated in FIG. 7, the cluster CL1 to the cluster CL2 are stored in one page in plane #0. The cluster CL3, which is a straddling cluster, is stored in both the one page in plane

0 and one page in plane #1. The cluster CL4 to the cluster CL6 are stored in the one page in plane #1. That is, plane #0 and plane #1 are to be individually subjected to a sense operation. It takes a longer time for the sense operation than for the data-out operation. Thus, the CPU 11 may control the order of enqueuing the second read commands into the command queue 146 to be able to preferentially execute the sense operation in plane #0 and plane #1.

As one example, as illustrated in FIG. 15, the CPU 11 enqueues a second read command for reading the cluster CL1, a second read command for reading the cluster CL3b, a second read command for reading the cluster CL2, a second read command for reading the cluster CL3a, a second read command for reading the cluster CL4, a second read command for reading the cluster CL5, and a second read command for reading the cluster CL6 into the command queue 146 in this order.

First, the sequencer 141 starts executing the second read command for reading the cluster CL1 (S601). The execution of the second read command for reading the cluster CL1 includes the sense operation, the data-out operation in the page transfer mode, and the output of the cluster CL1 from the waiting buffer #0. That is, the sequencer 141 selects the waiting buffer #0 in non-use. The NANDC 14 receives a page including the cluster CL1 from the memory chip 21 by the data-out operation in the page transfer mode and stores the page in the selected waiting buffer #0. The NANDC 14 outputs the cluster CL1 of the data stored in the selected waiting buffer #0 to the ECC circuit 145. At the start of executing the second read command for reading the cluster CL1, the count value of the counter 148 corresponding to the waiting buffer #0 is incremented by one to one.

Subsequently, the sequencer 141 starts executing the second read command for reading the cluster CL3b (S602) The execution of the second read command for reading the cluster CL3b includes the sense operation, the data-out operation in the page transfer mode, and the output of the cluster CL3b from the waiting buffer #1. That is, the sequencer 141 selects the waiting buffer #1 in non-use, and the NANDC 14 receives a page including the cluster CL3b from the memory chip 21 by the data-out operation in the page transfer mode and stores the page in the selected waiting buffer #1. The NANDC 14 outputs the cluster CL3b of the data stored in the selected waiting buffer #1 to the ECC circuit 145. At the start of executing the second read command for reading the cluster CL3b, the count value of the counter 148 corresponding to the waiting buffer #1 is incremented by one to one.

Subsequently, the sequencer 141 starts executing the second read command for reading the cluster CL2 (S603). The execution of the second read command for reading the cluster CL2 includes the output of the cluster CL2 from the waiting buffer #0. At the start of executing the second read command for reading the cluster CL2, the count value of the counter 148 corresponding to the waiting buffer #0 is incremented by one to two.

Subsequently, the sequencer 141 starts executing the second read command for reading the cluster CL3a (S604) The execution of the second read command for reading the cluster CL3a includes the output of the cluster CL3a from the waiting buffer #0. At the start of executing the second read command for reading the cluster CL3a, the count value of the counter 148 corresponding to the waiting buffer #0 is incremented by one to three.

Subsequently, the sequencer 141 starts executing the second read command for reading the cluster CL4 (S605). The execution of the second read command for reading the cluster CL4 includes the output of the cluster CL4 from the waiting buffer #1. At the start of executing the second read command for reading the cluster CL4, the count value of the counter 148 corresponding to the waiting buffer #1 is incremented by one to two.

Subsequently, the sequencer 141 starts executing the second read command for reading the cluster CL5 (S606). The execution of the second read command for reading the cluster CL5 includes the output of the cluster CL5 from the waiting buffer #1. At the start of executing the second read command for reading the cluster CL5, the count value of the counter 148 corresponding to the waiting buffer #1 is incremented by one to three.

Subsequently, the sequencer 141 starts executing the second read command for reading the cluster CL6 (S607). The execution of the second read command for reading the cluster CL6 includes the output of the cluster CL6 from the waiting buffer #1. At the start of executing the second read command for reading the cluster CL6, the count value of the counter 148 corresponding to the waiting buffer #1 is incremented by one to four.

The sequencer 141 completes outputting the cluster CL1 from the waiting buffer #0 to the ECC circuit 145 (S608). As a result, the count value of the counter 148 corresponding to the waiting buffer #0 is decremented by one to two.

The sequencer 141 then completes outputting the cluster CL2 from the waiting buffer #0 to the ECC circuit 145 (S609). As a result, the count value of the counter 148 corresponding to the waiting buffer #0 is decremented by one to one.

The sequencer 141 completes outputting the cluster CL3a from the waiting buffer #0 to the ECC circuit 145 (S610). As a result, the count value of the counter 148 corresponding to the waiting buffer #0 is decremented by one to zero.

The sequencer 141 completes outputting the cluster CL3b from the waiting buffer #1 to the ECC circuit 145 (S611). As a result, the count value of the counter 148 corresponding to the waiting buffer #1 is decremented by one to three.

Subsequently, the sequencer 141 completes outputting the cluster CL4 from the waiting buffer #1 to the ECC circuit 145 (S612). As a result, the count value of the counter 148 corresponding to the waiting buffer #1 is decremented by one to two.

Subsequently, the sequencer 141 completes outputting the cluster CL5 from the waiting buffer #1 to the ECC circuit 145 (S613). As a result, the count value of the counter 148 corresponding to the waiting buffer #1 is decremented by one to one.

The sequencer 141 completes outputting the cluster CL6 from the waiting buffer #1 to the ECC circuit 145 (S614). As a result, the count value of the counter 148 corresponding to the waiting buffer #1 is decremented by one to zero.

FIG. 16 is a flowchart illustrating exemplary operations of the waiting buffer group 142 and the random buffer 143 in the embodiment. The waiting buffer group 142 and the random buffer 143 are collectively referred to as a buffer. In FIG. 16, a series of operations that a buffer manager (not illustrated) manages is illustrated. The buffer manager manages data input and output to and from the waiting buffer group 142 and the random buffer 143. Thus, the buffer manager is a subject to perform the operations illustrated in FIG. 16.

First, the buffer manager determines whether to have received a buffer output command from the sequencer 141 (S701). After determining no receipt of the buffer output command (NO in S701), the buffer manager executes the operation in S701 again.

After receiving the buffer output command (YES in S701) for a target cluster whose read mode is the sequential read mode (YES in S702) and that is a straddling cluster (YES in S703), the buffer manager determines satisfaction or non-satisfaction of a condition that the waiting buffer group 142 stores a first amount or more of the first part of the target cluster and the buffer storage command and the buffer output command for the second part of the target cluster have been received from the sequencer 141 (S704).

In the sequential read mode of the target cluster, the buffer manager uses the waiting buffer group 142. As for the target cluster being the straddling cluster, the buffer manager stores a page including the first part of the target cluster in a waiting buffers 147 and stores a page including the second part of the target cluster in a different waiting buffer 147. The buffer manager can start outputting the target cluster from the waiting buffer group 142 as long as the waiting buffers 147 to store the pages including the first part and the second part of the target cluster are determined, the output commands for the first part and the second part of the target cluster are issued, and the waiting buffer 147 stores a given amount (herein, the first amount) of the first part of the target cluster. That is, in S704, the buffer manager determines whether the waiting buffer group 142 can start outputting the target cluster.

The first amount may be set freely. As one example, the first amount is determined depending on the bus width of the wiring connecting the waiting buffer group 142 and the random buffer 143 to the ECC circuit 145. For example, the first amount may be set to 64 bits if the bus width of the wiring connecting the waiting buffer group 142 and the random buffer 143 to the ECC circuit 145 is 64 bits.

After determining non-satisfaction of the condition in S704 (NO in S704), the buffer manager executes the operation in S704 again.

After determining satisfaction of the condition in S704 (YES in S704), the buffer manager outputs the first part and the second part of the target cluster from the waiting buffer group 142 in this order (S705). Then, the buffer manager returns to S701.

If part of the target cluster remains not stored in the waiting buffer group 142 at the time when the buffer manager determines the satisfaction of the condition (YES in S704), the buffer manager stores this part in the waiting buffer group 142 during the execution of the operation in S705. That is, the target cluster is input and output from and to the waiting buffer group 142 at the same time. This makes it possible to start the output of the target cluster early as compared with starting the operation of S705 after the first part and the second part of the target cluster are entirely stored in the waiting buffer group 142. Note that the buffer manager may wait for starting the operation in S705 until the first part and the second part of the target cluster are entirely stored in the waiting buffer group 142.

In the sequential read mode of the target cluster (YES in S702) and when the target cluster is not the straddling cluster (NO in S703), the buffer manager determines whether the waiting buffer group 142 stores the first amount or more of the target cluster (S706).

After determining that the waiting buffer group 142 does not store the first amount or more of the target cluster (NO in S706), the buffer manager executes the operation in S706 again.

After determining that the waiting buffer group 142 stores the first amount or more of the target cluster (YES in S706), the buffer manager outputs the target cluster from the waiting buffer group 142 (S707), returning to S701.

The buffer manager may wait for starting the operation in S707 until the entire target cluster is stored in the waiting buffer group 142.

In not the sequential read mode but the random read mode of the target cluster (NO in S702), the buffer manager stores the target cluster in the random buffer 143 regardless of whether the target cluster corresponds to the straddling cluster. The buffer manager determines whether the random buffer 143 stores the first amount or more of the target cluster (S708).

After determining that the random buffer 143 does not store the first amount or more of the target cluster (NO in S708), the buffer manager executes the operation in S708 again.

After determining that the random buffer 143 stores the first amount or more of the target cluster (YES in S708), the buffer manager outputs the target cluster from the random buffer 143 (S709). Then, the buffer manager returns to S701.

The buffer manager may wait for starting the operation in S709 until the entire target cluster is stored in the random buffer 143.

According to the embodiment, thus, in the sequential read mode for a read target cluster group containing a straddling cluster, the memory chip 21 transfers a page including at least part of the read target cluster to the NANDC 14 and the NANDC 14 stores the page in the waiting buffer group 142. The NANDC 14 sequentially outputs two or more read target clusters from the waiting buffer group 142 to the ECC circuit 145. As for a read target cluster being a straddling cluster, the NANDC 14 outputs the first part of the straddling cluster to the ECC circuit 145 from the waiting buffer 147 storing the page including the first part, and then outputs the second part of the straddling cluster to the ECC circuit 145 from another waiting buffer 147 storing the page including the second part.

That is, according to the embodiment, in the sequential read mode set for the two or more clusters containing the straddling cluster, it is unnecessary for the NANDC 14 to adjust timing between the data-out operation to the first part and the data-out operation to the second part.

According to the embodiment, thus, it is possible to operate plane #0 and plane #1 in parallel in the sequential read mode.

Figure 17:
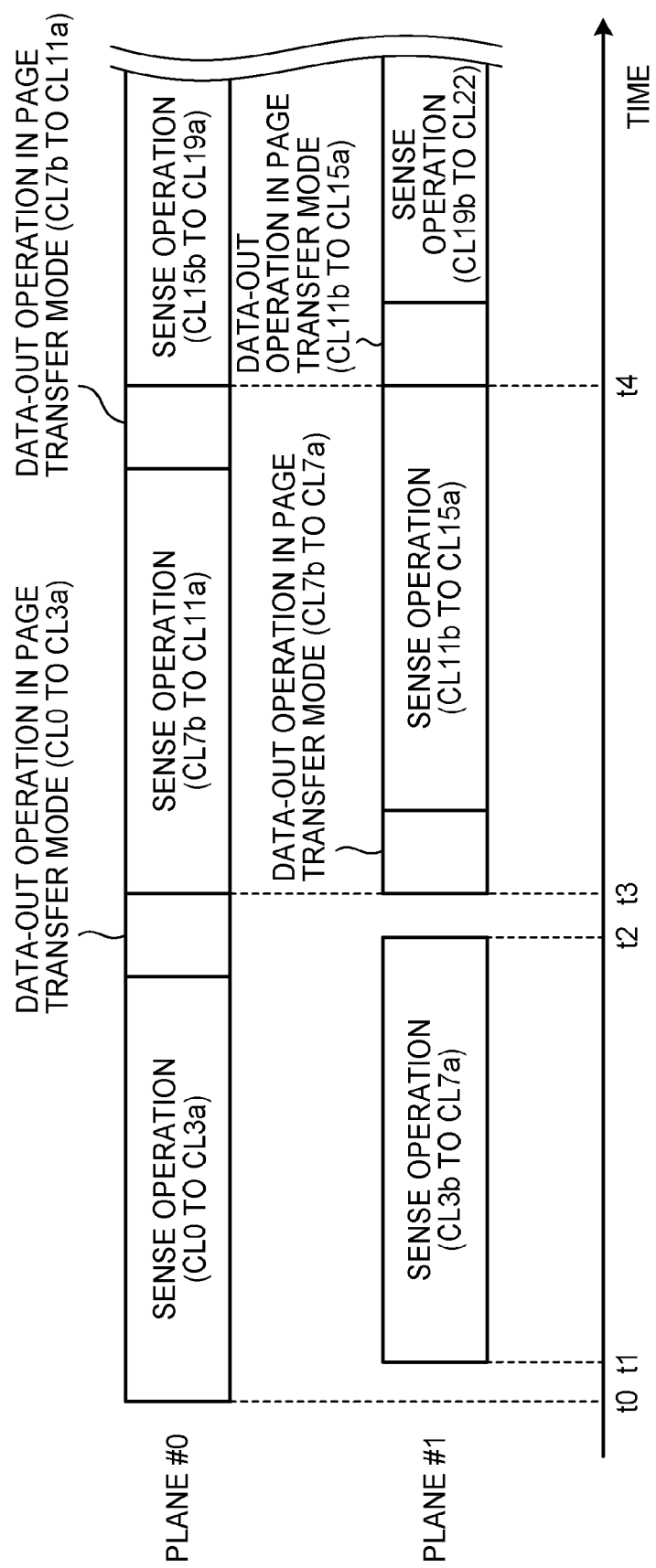
FIG. 17 is a view illustrating an example of operating two planes in parallel in one memory chip according to the embodiment.

FIG. 17 is a view illustrating an example of operating two planes in parallel in one memory chip 21 according to the embodiment. In this example, for a super page whose value N is set to 23, the entry queue 134 stores 23 first read commands for sequentially reading a cluster CL0 to a cluster CL6, a cluster CL8, a cluster CL7, and a cluster CL9 to a cluster CL22. Also in this example, by the determination in S103, the sequential read mode is then set to read the cluster CL0 to the cluster CL6, the cluster CL8, the cluster CL7, and the cluster CL9 to the cluster CL22.

The cluster CL3, the cluster CL7, the cluster CL11, the cluster CL15, and the cluster CL19 are straddling clusters. The first part of the straddling cluster is referred to as a cluster CLYa, and the second part of the straddling cluster is referred to as a cluster CLYb where Y represents 3, 7, 11, 15, or 19.

The NANDC 14 first causes the access circuit 24 in plane #0 to execute a sense operation for storing a page including the clusters CL0 to CL3a in the data latch 25 (time t0). The access circuit 24 in plane #0 then starts the sense operation.

Subsequently, the NANDC 14 causes the access circuit 24 in plane #1 to execute a sense operation for storing a page including the clusters CL3b to CL7a in the data latch 25 (time t1). The access circuit 24 in plane #1 then starts the sense operation.

After completion of the sense operation in plane #0, the NANDC 14 executes the data-out operation to the page including the clusters CL0 to CL3a. That is, the NANDC 14 acquires the page including the clusters CL0 to CL3a from the data latch 25 in plane #0 in the page transfer mode.

The access circuit 24 completes the sense operation to the page including the clusters CL3b to CL7a (time t2). In FIG. 16, the time t2 at which the sense operation of the page including the clusters CL3b to CL7a completes is earlier than the time at which the data-out operation to the page including the clusters CL0 to CL3a completes. During the data-out operation, the channels are occupied for handling the data-out operation. Thus, the NANDC 14 waits for execution of the data-out operation to the page including the clusters CL3b to CL7a until the channels become available.

After completing the data-out operation to the page including the clusters CL0 to CL3a in the page transfer mode, the NANDC 14 causes the access circuit 24 in plane #0 to execute a sense operation for storing a page including the clusters CL7b to CL11a in the data latch 25, and executes the data-out operation to the page including the clusters CL3b to CL7a stored in the data latch 25 in plane #1 in the page transfer mode (time t3).

After completing the data-out operation to the page including the clusters CL3b to CL7a in the page transfer mode, the NANDC 14 causes the access circuit 24 in plane #1 to execute a sense operation for storing a page including the clusters CL11b to CL15a in the data latch 25.

After completion of the sense operation of the page including the clusters CL7b to CL11a in plane #0, the NANDC 14 starts the data-out operation to the page including the clusters CL7b to CL11a.

In FIG. 17, the data-out operation to the page including the clusters CL7b to CL11a in plane #0 and the sense operation to the page including the clusters CL11b to CL15a in plane #1 complete at substantially the same timing. After completing the data-out operation to the page including the clusters CL7b to CL11a in plane #0 and the sense operation to the page including the clusters CL11b to CL15a in plane #1, the NANDC 14 causes the access circuit 24 in plane #0 to execute a sense operation for storing a page including the clusters CL15b to CL19a in the data latch 25, and then executes the data-out operation to the page including the clusters CL11b to CL15a stored in the data latch 25 in plane #1 in the page transfer mode (time t4).

After completing the data-out operation to the page including the clusters CL11b to CL15a in the page transfer mode in plane #1, the NANDC 14 causes the access circuit 24 in plane #1 to execute a sense operation for storing a page including the clusters CL19b to CL22 in the data latch 25. Description of the subsequent operations is omitted.

In the NANDC 14, the waiting buffer group 142 stores the page including the clusters CL0 to CL3a, the page including the clusters CL3b to CL7a, the page including the clusters CL7b to CL11a, the page including the clusters CL11b to CL15a, the page including the clusters CL15b to CL19a, and the page including the clusters CL19b to CL22. The NANDC 14 sequentially outputs the cluster CL0 to the cluster CL6, the cluster CL7, the cluster CL8, and the cluster CL9 to the cluster CL22 from the waiting buffer group 142 to the ECC circuit 145.

In the sequential read mode, it is not necessary for the NANDC 14 to adjust the timing for the two data-out operations to the first part and the second part of each straddling cluster included in the read target clusters. This makes it possible for the NANDC 14 to perform an interleave operation such that the data-out operation is executed to one of the two planes while the other is subjected to a sense operation and that the sense operation is executed to the one plane while the other plane is subjected to the data-out operation, as illustrated in FIG. 17.

According to the embodiment, as described above, as to a read target cluster being a straddling cluster, a part (referred to as a first fragment) of which is stored in the sub-array 23 in plane #0 and the rest (referred to as a second fragment) of which is stored in the sub-array in plane #1, the memory controller 10, particularly, the NANDC 14, can execute the following operations. That is, the NANDC 14 causes the access circuit 24 in plane #0 to execute a sense operation to a page including the first fragment for storing the page in the data latch 25 in plane #0, and causes the access circuit 24 in plane #1 to execute a sense operation to another page including the second fragment for storing said another page in the data latch 25 in plane #1. Then, the NANDC 14 causes the memory chip 21 to output the page including the first fragment from the data latch 25 in plane #0, and stores the page including the first fragment in one of the waiting buffers 147 (referred to as a first buffer). In addition, the NANDC 14 causes the memory chip 21 to output the page including the second fragment from the data latch 25 in plane #1, and stores the page including the second fragment in another one of the waiting buffers 147 (referred to as a second buffer). The NANDC 14 reads the first fragment from the page stored in the first buffer and the second fragment from the page stored in the second buffer, to combine the fragments and input the combined fragments to the ECC circuit 145.

Such an operation can eliminate the necessity for adjusting the timing between the data-out operation to transfer the first fragment and the data-out operation to transfer the second fragment. This enables plane #0 and plane #1 to perform an interleave operation, thereby improving the data transfer rate from the memory chip 21 to the memory controller 10.

According to the present embodiment, the NANDC 14 transmits a data-out command set for outputting the page including the first fragment to the memory chip 21. In response to receipt of the data-out command set, the memory chip 21 outputs the page including the first fragment on a page basis. In other words, the memory chip 21 outputs the entire of the page including the first fragment without receiving any command. Further, the NANDC 14 transmits a data-out command set for outputting the page including the second fragment to the memory chip 21. In response to receipt of the data-out command set, the memory chip 21 outputs the page including the second fragment on a page basis. In other words, the memory chip 21 outputs the entire of the page including the second fragment without receiving any command.

Thus, with respect to the page including another read target cluster being not a straddling cluster in addition to the first fragment or the second fragment, the NANDC 14 can acquire another read target cluster in question from the first buffer or the second buffer. That is, the NANDC 14 does not have to execute the data-out operations individually to another read target cluster and the straddling cluster.

According to the embodiment, the NANDC 14 are operable in either of the page transfer mode and the cluster transfer mode. The data transfer mode from the memory chip 21 to the NANDC 14 may include any mode in addition to the page transfer mode and the cluster transfer mode.

According to the embodiment, the memory controller 10, particularly the CPU 11, determines whether either the page including the first fragment or the page including the second fragment contains another read target cluster. After determining either of the pages containing another read target cluster, the CPU 11 selects the sequential read mode. In the sequential read mode as selected, the NANDC 14 executes the data-out operation in the page transfer mode. After determining none of the pages containing another read target cluster, the CPU 11 selects the random read mode. In the random read mode as selected, the NANDC 14 executes the data-out operation in the cluster transfer mode.

According to the embodiment, in the random read mode, the memory controller 10, particularly the NANDC 14, causes the memory chip 21 to output the first fragment in the page from the data latch 25 in plane #0 and output the second fragment in the page from the data latch 25 in plane #1. The NANDC 14 then combines the first fragment and second fragment for input to the ECC circuit 145.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a memory chip including a first plane and a second plane,
the first plane including a first storage area from which data is read in a unit of a first size, and a first data latch capable of storing data having the first size, and
the second plane including a second storage area from which data is read in a unit of the first size, and a second data latch capable of storing data having the first size;
a plurality of buffers each of which is capable of storing data having the first size, the plurality of buffers including a first buffer and a second buffer; and
a controller including an error correction circuit and being configured to:
in a case where first data having a second size is stored across the first storage area and the second storage area, the second size being smaller than the first size,
cause the memory chip to store second data in the first data latch, the second data having the first size and including a first fragment of the first data stored in the first storage area;
cause the memory chip to store third data in the second data latch, the third data having the first size and including a second fragment of the first data stored in the second storage area;
cause the memory chip to output the second data from the first data latch, store the output second data in the first buffer;
cause the memory chip to output the third data from the second data latch, store the output third data in the second buffer;
combine the first fragment in the second data stored in the first buffer and the second fragment in the third data stored in the second buffer to generate fourth data; and
input the fourth data to the error correction circuit.

2. The memory system according to claim 1, wherein
the fourth data has the second size, and
the second size is a unit of an error correction executed by the error correction circuit.

3. The memory system according to claim 2, wherein
the controller is configured to:
in a case where the third data is stored in the second buffer prior to the second data being stored in the first buffer, generate the fourth data such that the first fragment in the second data is input to the error generation circuit prior to the second fragment in the third data.

4. The memory system according to claim 1, wherein
the controller is further configured to:
transmit a first command set for instructing the memory chip to output the second data from the first data latch; and
transmit a second command set for instructing the memory chip to output the third data from the second data latch, and
the memory chip is configured to:
start outputting the second data in response to receipt of the first command set, and output the entire of the second data without receiving any other commands than the first command set; and
start outputting the third data in response to receipt of the second command set, and output the entire of the third data without receiving any other commands than the second command set.

5. The memory system according to claim 1, wherein
the controller is further configured to:
select a plurality of read modes including a first read mode and a second read mode;
cause the memory chip to output data in a unit of the first size in the first read mode; and
cause the memory chip to output data in a unit of the second size in the second read mode.

6. The memory system according to claim 5, wherein
the controller is further configured to:
determine whether the second data includes fifth data having the second size, the fifth data being a read target and different from the first data;
select the first read mode to cause the memory chip to output the entire of the second data including the first fragment and the fifth data upon determining that the second data includes the fifth data; and
select the second read mode to cause the memory chip to output a part of the second data including the first fragment upon determining that the second data includes no fifth data.

7. The memory system according to claim 5, wherein
the controller is configured to:
in the second read mode, cause the memory chip to output the first fragment in the second data from the first data latch prior to causing the memory chip to output the second fragment in the third data from the second data latch;
combine the first fragment and the second fragment output from the memory chip to generate sixth data having the second size; and
input the sixth data to the error correction circuit.

8. The memory system according to claim 5, wherein
the controller is further configured to:
in combining the first fragment and the second fragment, determine whether the second data is still stored in the first data latch; and only in a case where the second data is stored in both the first data latch and the first buffer, use the first fragment in the second data stored in the first buffer.

9. The memory system according to claim 8, wherein the controller is configured to:
determine that the second data is not stored in the first data latch in a case where a data erase operation or a write operation is performed to the first storage area since the controller caused the memory chip to store the second data in the first data latch.

10. The memory system according to claim 1, wherein the controller is configured to:
cause the memory chip to output the second data from the first data latch and cause the memory chip to store the third data in the second data latch in parallel.

11. A method of controlling a memory chip, the memory chip including a first plane and a second plane, the first plane including a first storage area and a first data latch, data being read from the first storage area in a unit of a first size, the first data latch being capable of storing data having the first size, the second plane including a second storage area and a second data latch, data being read from the second storage area in a unit of the first size, the second data latch being capable of storing data having the first size, said method comprising:
in a case where first data having a second size is stored across the first storage area and the second storage area, the second size being smaller than the first size,
causing the memory chip to store second data in the first data latch, the second data having the first size and including a first fragment of the first data stored in the first storage area;
causing the memory chip to store third data in the second data latch, the third data having the first size and including a second fragment of the first data stored in the second storage area;
causing the memory chip to output the second data from the first data latch, storing the output second data in a first buffer among a plurality of buffers each of which is capable of storing data having the first size;
causing the memory chip to output the third data from the second data latch, storing the output third data in a second buffer among the plurality of buffers, the second buffer being different from the first buffer;
combining the first fragment in the second data stored in the first buffer and the second fragment in the third data stored in the second buffer to generate fourth data; and
inputting the fourth data to an error correction circuit.

12. The method according to claim 11, wherein the fourth data has the second size, and
the second size is a unit of an error correction executed by the error correction circuit.

13. The method according to claim 12, wherein in a case where the third data is stored in the second buffer prior to the second data being stored in the first buffer, the fourth data is generated such that the first fragment in the second data is input to the error generation circuit prior to the second fragment in the third data.

14. The method according to claim 11, further comprising:
transmitting a first command set for instructing the memory chip to output the second data from the first data latch; and
transmitting a second command set for instructing the memory chip to output the third data from the second data latch, wherein
the memory chip is configured to:
start outputting the second data in response to receipt of the first command set, and output the entire of the second data without receiving any other commands than the first command set; and
start outputting the third data in response to receipt of the second command set, and output the entire of the third data without receiving any other commands than the second command set.

15. The method according to claim 11, further comprising:
selecting a plurality of read modes including a first read mode and a second read mode;
causing the memory chip to output data in a unit of the first size in the first read mode; and
causing the memory chip to output data in a unit of the second size in the second read mode.

16. The method according to claim 15, further comprising:
determining whether the second data includes fifth data having the second size, the fifth data being a read target and different from the first data;
selecting the first read mode to cause the memory chip to output the entire of the second data including the first fragment and the fifth data upon determining that the second data includes the fifth data; and
selecting the second read mode to cause the memory chip to output a part of the second data including the first fragment upon determining that the second data includes no fifth data.

17. The method according to claim 15, wherein in the second read mode, the memory chip is caused to output the first fragment in the second data from the first data latch prior to the memory chip being caused to output the second fragment in the third data from the second data latch, wherein said method further comprises:
combining the first fragment and the second fragment output from the memory chip to generate sixth data having the second size; and
inputting the sixth data to the error correction circuit.

18. The method according to claim 15, further comprising:
in combining the first fragment and the second fragment, determining whether the second data is still stored in the first data latch; and
only in a case where the second data is stored in both the first data latch and the first buffer, using the first fragment in the second data stored in the first buffer.

19. The method according to claim 18, wherein the second data is determined not to be stored in the first data latch in a case where a data erase operation or a write operation is performed to the first storage area since the memory chip was caused to store the second data in the first data latch.

20. The method according to claim 11, wherein causing the memory chip to output the second data from the first data latch and causing the memory chip to store the third data in the second data latch are executed in parallel.

* * * * *